(12) United States Patent  
Abele

(10) Patent No.: US 6,963,200 B2
(45) Date of Patent: Nov. 8, 2005

(54) NMR IMAGING SYSTEM WITH CONICAL PERMANENT MAGNET

(75) Inventor: Manlio Abele, New York, NY (US)

(73) Assignee: BRK Wireless Company, Inc., Park Ridge, IL (US)

( * ) Notice: Subject to any disclaimer, the term of this patent is extended or adjusted under 35 U.S.C. 154(b) by 88 days.

(21) Appl. No.: 10/679,596

(22) Filed: Oct. 6, 2003

(65) Prior Publication Data

US 2004/0135580 A1 Jul. 15, 2004

Related U.S. Application Data

(63) Continuation-in-part of application No. 10/393,999, filed on Mar. 24, 2003, now Pat. No. 6,707,363, which is a continuation-in-part of application No. 10/336,333, filed on Jan. 6, 2003, now abandoned.

(51) Int. Cl.⁷ ................................................. G01V 3/00
(52) U.S. Cl. ..................................................... 324/319
(58) Field of Search ................................. 324/307, 309, 324/318–320; 335/296, 299, 301, 302, 304, 306

(56) References Cited

U.S. PATENT DOCUMENTS

| | | | | |
|---|---|---|---|---|
| 5,034,715 A | * | 7/1991 | Leupold et al. | 335/306 |
| 5,175,499 A | * | 12/1992 | Davies | 324/300 |
| 6,163,240 A | * | 12/2000 | Zuk et al. | 335/299 |
| 6,600,401 B2 | * | 7/2003 | Zuk et al. | 335/299 |
| 6,618,606 B2 | * | 9/2003 | Overweg et al. | 600/410 |
| 6,717,408 B2 | * | 4/2004 | Minas et al. | 324/318 |
| 6,741,078 B2 | * | 5/2004 | Overweg | 324/318 |
| 2003/0164704 A1 | * | 9/2003 | Yoshida | 324/322 |

* cited by examiner

*Primary Examiner*—Christopher W. Fulton
*Assistant Examiner*—Dixomara Vargas

(57) ABSTRACT

An open magnetic structure comprising a conical magnetic structure that generates an NMR imaging field around the head of a patient, and a transition magnetic structure including a cylindrical magnet connected to the conical magnetic structures that extends the uniform field generated in the head magnet cavity to or near the shoulders of the patient. The overall geometry is designed to integrate the magnetic structure in a surgical suite with a minimum interference with surgical procedures, which typically involve surgery on the brain of the patient. A method for improving field uniformity by shimming is also included. Advantages include improved field uniformity, and reduced weight and size.

33 Claims, 14 Drawing Sheets

NMR IMAGING SYSTEM WITH CONICAL PERMANENT MAGNET

RELATED APPLICATION

This application is a continuation-in-part by the same inventor of a first commonly-owned application, Ser. No. 10/336,333, filed Jan. 6, 2003, now abandoned.

This application is a continuation-in-part by the same inventor of a second commonly-owned application, Ser. No. 10/393,999, filed Mar. 24, 2003, now U.S. Pat. No. 6,707, 363.

The invention is directed to an NMR head imaging system using permanent magnets to establish the uniform imaging field.

BACKGROUND OF INVENTION

The first related application, whose full contents are herein incorporated by reference, describes a magnetic structure designed for NMR head imaging in interventional procedures. The requirements to be satisfied are described in detail in the related application. These requirements are satisfied by a permanent magnetic structure capable of generating a uniform field for NMR imaging over a region of interest encompassing the head of a patient and that is open at one side allowing access to the head of the patient by a physician for surgical or other medical purposes. In a preferred embodiment described in that application, the magnetic structure of the invention comprises a head structure generating a uniform magnetic field in a region of interest encompassing the patient's head, coaxially aligned with a shoulder structure generating a magnetic field that extends the uniform field to a second larger region encompassing the patient's shoulder, and joined to the head structure by a coaxially aligned transition structure which maintains the uniform magnetic field in the region connecting the first and second regions. A feature of that invention is a magnetic structure comprising a single pole piece that extends throughout the structure, which pole piece is connected to the head, shoulder, and transition magnetic structures, with the single pole piece in the shoulder region being configured to house a second magnet that cooperates in extending the uniform field to the shoulder region.

The second related application, whose full contents are herein incorporated by reference, describes a magnetic structure designed for NMR head imaging in interventional procedures which differs from the first application in that the permanent magnetic system is based on the use of a conical magnet or section of a conical magnet. In a preferred embodiment, the conical section is connected to an inner essentially cylindrical section, and the region inside the conical magnet comprises a high-permeability ferromagnetic material. In a further preferred embodiment, the magnetic structure comprises opposed, spaced circular-symmetric structures with the region of interest falling within a cavity between the circular-symmetric structures and a second larger outer cylindrical magnet extends over each of the circular-symmetric structures. The three main permanent magnetic components of the structure of the preferred embodiment are all magnetized in the same direction, preferably parallel to the axis of the conical segment.

SUMMARY OF INVENTION

An object of the present invention is an improved NMR head imaging system based on the conical magnetic system that provides improved field uniformity in the region of interest and offers the possibility of a higher field intensity of the NMR imaging field or a structure of reduced weight and size.

These objects are achieved in accordance with one aspect of the invention by a structure of the magnet wherein the inner essentially cylindrical section is more closely coupled to the conical section. This may introduce field distortions in or near the region of interest. Transition means where the inner cylindrical section and conical section interface are provided to correct for any such field distortions.

In a preferred embodiment, the inner essentially cylindrical section is essentially integrated with the conical section with at least one magnetic strap positioned to extend radially within the inner essentially cylindrical section to force surfaces intended to be equipotential to become more equipotential. In a further preferred embodiment, the magnetic strap extends up to but spaced from the inner surface of the conical section. In this preferred embodiment, a further improvement is possible by adjusting the value of the design factor K to, typically, a value slightly larger than the factor originally used in the design, in accordance with a method feature of the invention. In still another preferred embodiment, a further improvement is possible by use of a novel shimming technique based on the measurement of the active field generated by the assembled magnetic structure.

In still a further preferred embodiment, the inner ferromagnetic filling of the magnetic conical section is recessed to incorporate an inwardly extending section of the second outer cylindrical magnet, which reduces the weight and size of the overall magnetic structure.

As in the second related application, the three main permanent magnetic components of the structure of the preferred embodiment are preferably all magnetized in the same direction, preferably parallel to the axis of the conical section.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described parts of the second related application as well as the preferred embodiments of the present invention, like reference numerals or letters signifying the same or similar components.

DETAILED DESCRIPTION OF PREFERRED EMBODIMENTS

Figure 1:
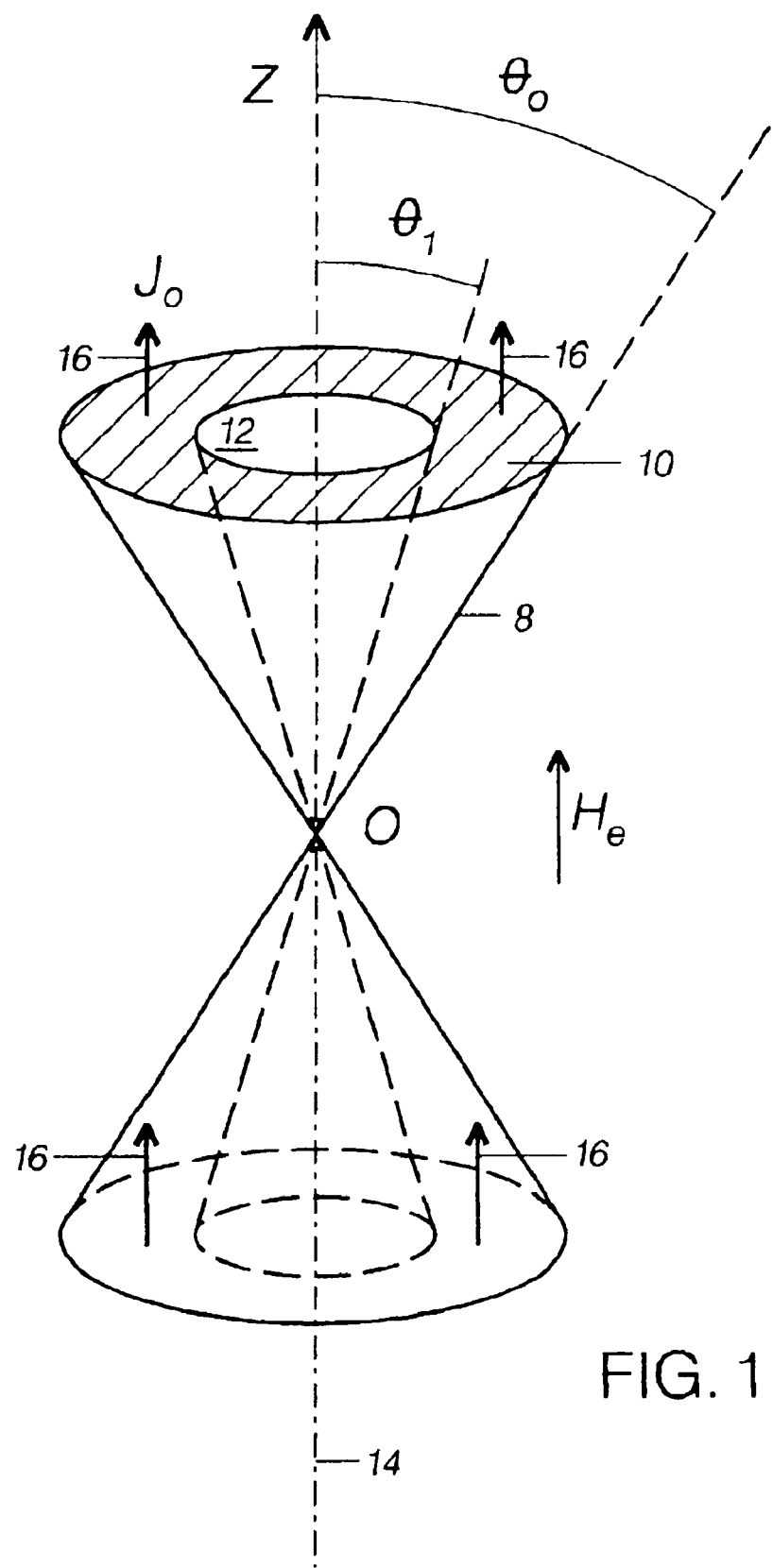
FIG. 1 is a schematic perspective view of a conical magnetic structure to explain several of the principles on which the invention is based.

For a better understanding of the present invention, the reader is urged to read the many technical papers which I alone or with others published and which describe various configurations of NMR imaging systems as well as various schemes for compensating for magnetic field disturbances in composite structures that have been characterized as yoked, yokeless, or hybrid magnets. Particular attention is directed to issued U.S. Pat. Nos. 5,495,222; 5,790,006, and 6,265,959 which describe some of the problems of fabricating open magnetic structures with NMR imaging uniform fields and some solutions to those problems, the contents of which patents and publications are herein incorporated by reference.

It will also help to present some definitions of terms used herein to avoid ambiguity. These definitions include the following.

A "high permeability" member, as used herein, shall mean a soft ferromagnetic body having a permeability, $\mu$, exceeding 10 and preferably as high as possible. For simplicity, it is sometimes referred to in the literature as a ($\mu=\infty$) material, i.e., an ideal soft ferromagnetic body. For virtually all practical purposes, the performance of infinite permeability, unsaturated ferromagnetic material is the equivalent of soft iron.

A "yoked magnetic system", as used herein, is a permanent magnetic structure surrounded by a body of high permeability material serving as a yoke to carry the return flux of the induction B from one pole of the magnetic structure to the other pole. To avoid saturation, the yoke should have a large enough cross sectional area to convey the flux without saturating. The cross section typically varies to satisfy local flux-carrying requirements.

A "hybrid magnetic system", as used herein, is a permanent magnetic structure only partially surrounded by a body of high permeability material, both the high permeability material where present and the non-surrounded parts of the structure serving to carry the return flux of the induction B from one pole of the magnetic structure to the other pole. To avoid saturation, the body of high permeability material which can also be called a yoke should have a large enough cross sectional area to convey the flux without saturating. The yoke cross section typically varies to satisfy local flux-carrying requirements.

A "uniform magnetic field", as used herein, shall mean a magnetic field that over a region of interest has an intensity that varies by less than about 10 ppm.

A "magnetic dipole", as used herein, is a permanent magnetic element with a north pole on one end or side and a south pole at its opposite end or side. It can have various shapes. It can, for example, be a small chunk or block or plate typically mounted on a surface bounding the region of interest. For the conical geometry, the preferred magnetic dipole shape is a ring element surrounding and mounted on the conical surface of the permanent magnetic conical element of the structure.

The term "substantially" appears from time to time in the specification and claims. It should be understood in a practical sense to mean small variations in some structure or parameter term that do not make significant changes in properties associated with those structures or parameters and are included within the scope of the associated term.

The term "essentially" appears from time to time in the specification and claims. It should be understood in a practical sense to mean that it defines a structure which functionally can be characterized in a certain way but in which other aspects of the structure may be present that do not strictly conform to the sense used but also do not significantly detract from its prime or essential function. For example, a magnet may be referred to as essentially cylindrical, when in fact it may have non-cylindrical portions. But for design purposes, the magnet can still be characterized as cylindrical as the latter term signifies its main functional attributes.

Magnetic systems of this kind are often designed using a so-called non-dimensional number identified by the symbol K, which can vary between 0 and 1. Typically, one starts the design with a chosen value for K depending upon the magnetic materials available and the field intensity desired, and this value of K remains unchanged. However, in accordance with a feature of the present invention, it turns out that relatively small changes in the value for K can have a significant effect on field uniformity, as will be explained below. It will also be understood that permanent magnetic materials having the highest magnetic properties including remanence are preferred. Nowadays, these are the family of rare earth magnets such as Nd,B,Fe. Variations in the relative proportions of the main ingredients of such magnets, as is well known in the art, typically results in variations of the alloys main magnetic properties, a fact that ma be use to implement the above feature of the invention.

When the application speaks of "configuring" the magnetic structure, this is to be understood in the context of this and the referenced literature to mean the design scheme of selecting the geometry, dimensions, materials, and magnetizations of the various members of the structure in the light of the design parameter K chosen and such additional constraints as the desired active field intensity, maintenance of field uniformity, and reduction of stray fields.

Open magnetic structures used to implement NMR imaging are often constructed of blocks of permanent magnetic material assembled to form the configuration of the sides, top, and bottom of the structure desired and defining a cavity on its interior for receiving the patient. This is typically a simpler scheme for fabricating such systems as regularly shaped blocks uniformly magnetized in a single direction are easier to fabricate by the usual powder metallurgy and grinding steps. Thus, where the specification or claims call for, for example, a conical or cylindrical-shaped magnetic structure, this should be understood to include a single member with that configuration, or several members held together by magnetic forces forming a composite member with that configuration, since, magnetically speaking, the performance is substantially the same. Moreover, though the magnetic shapes used to illustrate the invention are typically shown with smooth surfaces, in many cases the structure configuration could be implemented with several joined magnetic members which together produce a functional equivalent. For example, the round surface of a conical or cylindrical configuration can sometimes be more easily obtained with a composite structure made up of thin round slabs of permanent magnetic material which form a slightly stepped outer surface. The composite structure, overall, would still be classified as conical or cylindrical, as the case may be, and the resultant orientation of their magnetic fields can still be represented by a single arrow. For convenience, it may also be simpler to define the system using an arbitrary rectangular or spherical coordinate system, in which, as shown in the literature referenced, linear dimensions of the rectangular system coordinate system are measured along the x, y or z dimension, and the corresponding dimensions of the spherical coordinate system are measured along radii and by angles from arbitrary lines or planes. Also, for convenience of explanation, in the preferred embodiment which is analyzed in the spherical coordinate system, the direction of the uniform field is chosen parallel to the z axis which happens to be the cone axis also, and the patient's orientation is chosen such that his or her longitudinal axis is perpendicular to the z axis, so that, when the patient is within the magnetic structure for head imaging in a normal position flat on his or her back, his or her body stretches in a direction perpendicular to the z direction, and thus perpendicular to the direction of the uniform field at the plane of the body. The patient would normally lie on a non-magnetic table within the system, but for convenience the table is not shown in the drawings as it has no effect on the magnetic properties. The spherical coordinate system is indicated in the drawings. The description of the invention focuses on the magnetic structure in the vicinity of the head and shoulders of the patient. It will also be understood that, in practical situations, normal manufacturing tolerances both in dimensions as well as in magnetic properties of the magnetic blocks introduce minor field distortions and fluctuations which are commonly compensated by a known process called "tuning", using shims to adjust the positions of the magnetic members, and filters for field non-uniformities. Also, in the drawings, arrows are present labeled with a J or H where J is the standard symbol for remanence, H the standard symbol for the magnitude of the uniform field, and $\mu$ the standard symbol for magnetic permeability.

The concepts underlying the development of the invention involve the following recognitions.

1. A uniform magnetic field capable of implementing NMR imaging can be generated in a cavity by a conical structure defining an inner conical section and a coaxial outer conical section positioned adjacent the cavity, with selected cone angles.

2. The conical shape provides a small cavity connected to an adjacent larger cavity, in which the small cavity can be configured to accommodate the head of a patient, and the adjacent larger cavity can be configured to accommodate the shoulders of the patient.

3. The outer conical section comprises permanent magnetic material and the inner conical section comprises high permeability magnetic material.

4. It is also desirable to provide a uniform field capable of implementing NMR imaging by extending laterally the outer cone magnet by an additional first permanent magnet (sometimes referred to as the inner cylindrical permanent magnet), with both permanent magnet members having their remanences oriented in the same direction which is the axis of symmetry of the overall structure and also the orientation of the uniform field in the cavity.

5. The strength of the uniform field can be augmented by positioning an additional second permanent magnet on the outside of the conical structure, i.e., adjacent the wide end of the conical structure, (sometimes referred to as the outer cylindrical permanent magnet) with its remanence oriented in the same direction as that of the first additional permanent magnet.

In implementing the principles described above, a number of different configurations of magnetized material and soft ferromagnetic materials may be used. Preferred configurations will be described in detail below, but it will be understood that the invention is not limited to those particular configurations and dimensions where indicated and other different combinations of magnetic materials and of other dimensions can be employed following the principles described below to achieve the benefits of the invention, as will be understood by those skilled in this art.

The reader's attention is directed to the attached Appendix which is a more rigorous mathematical explanation of the principles on which the present invention is based. The following description will focus on the structural arrangements. For more details of how to implement embodiments of the invention, the reader is urged to also review the Appendix whose full contents are herein incorporated by reference as supplemented by the referenced paper and patents. The description found in the second related application will be described first as a knowledge of it will make easier for the reader an understanding of the improvement of the present application.

The invention can be better understood in the context of the simple conical structure illustrated in FIG. 1 comprising two coaxial cones 10, 12 having a common cone axis 14 also designated as the z axis. The conical structure at the top has an apex at the center labeled 0 which is also the apex of the symmetrical inverted conical structure at the bottom. The outer cone 10 is shown cross hatched for clarity and is contained between half-angle $\theta_0$ and half-angle $\theta_1$. The outer cone 10 is shown magnetized uniformly with the remanence 16 oriented vertically as shown parallel to the z axis. The inner cone 12 is shown without hatching for clarity and is assumed to be ferromagnetic with a high permeability. Outside of the cone's outer conical surfaces 8 is a non-magnetic medium. As explained in the Appendix, there will be formed adjacent the cone 10 a uniform magnetic field that is also oriented parallel to the z-axis. The equipotential lines for the region adjacent the right side 8 of the upper cone magnet 10 is indicated at 18 in FIG. 2, and the equipotential lines inside the magnet 10 is indicated at 29. For the example given later on, to which the invention is not limited, the conical structure of FIG. 1 generates a uniform field of intensity approximately equal to 0.55 Tesla.

Figure 3:
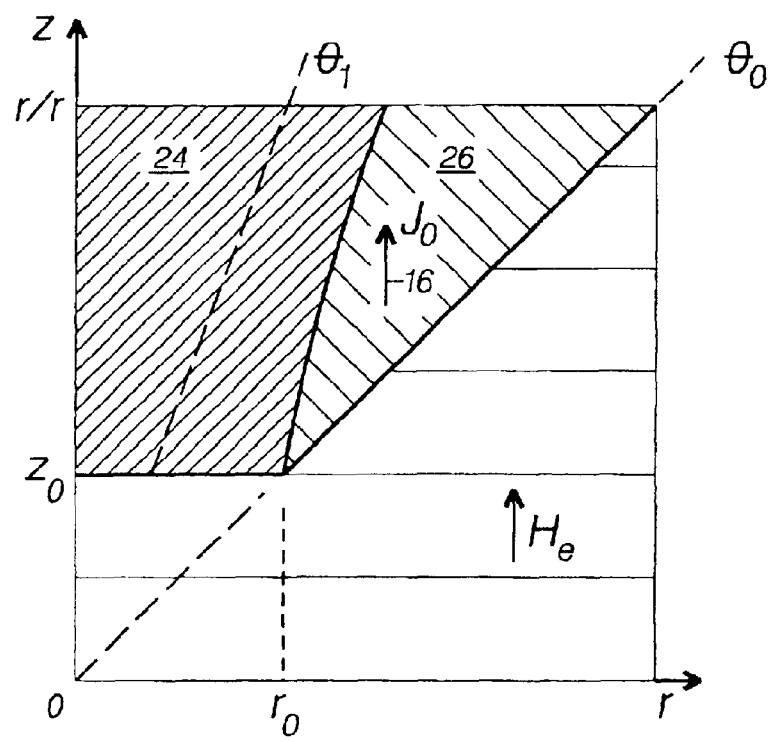
FIG. 3 is a cross-sectional view of part of one form of magnetic structure in accordance with the invention. In this figure and in several of the other figures, only one quarter of the actual structure is shown, as the remaining three quarters are essentially in images. In particular, a mirror image of that quarter is present on the opposite side of the vertical axis which if present would illustrate the top half of the full structure, and, similarly, a mirror image of that top half is present on the opposite side of the horizontal axis which if present would illustrate both the top and bottom halves and thus the full structure in accordance with the invention. One embodiment of the full structure according to the invention is illustrated in FIGS. 8 and 9. It will be apparent from the figures which ones represent only part of the full structure.
Figure 4:
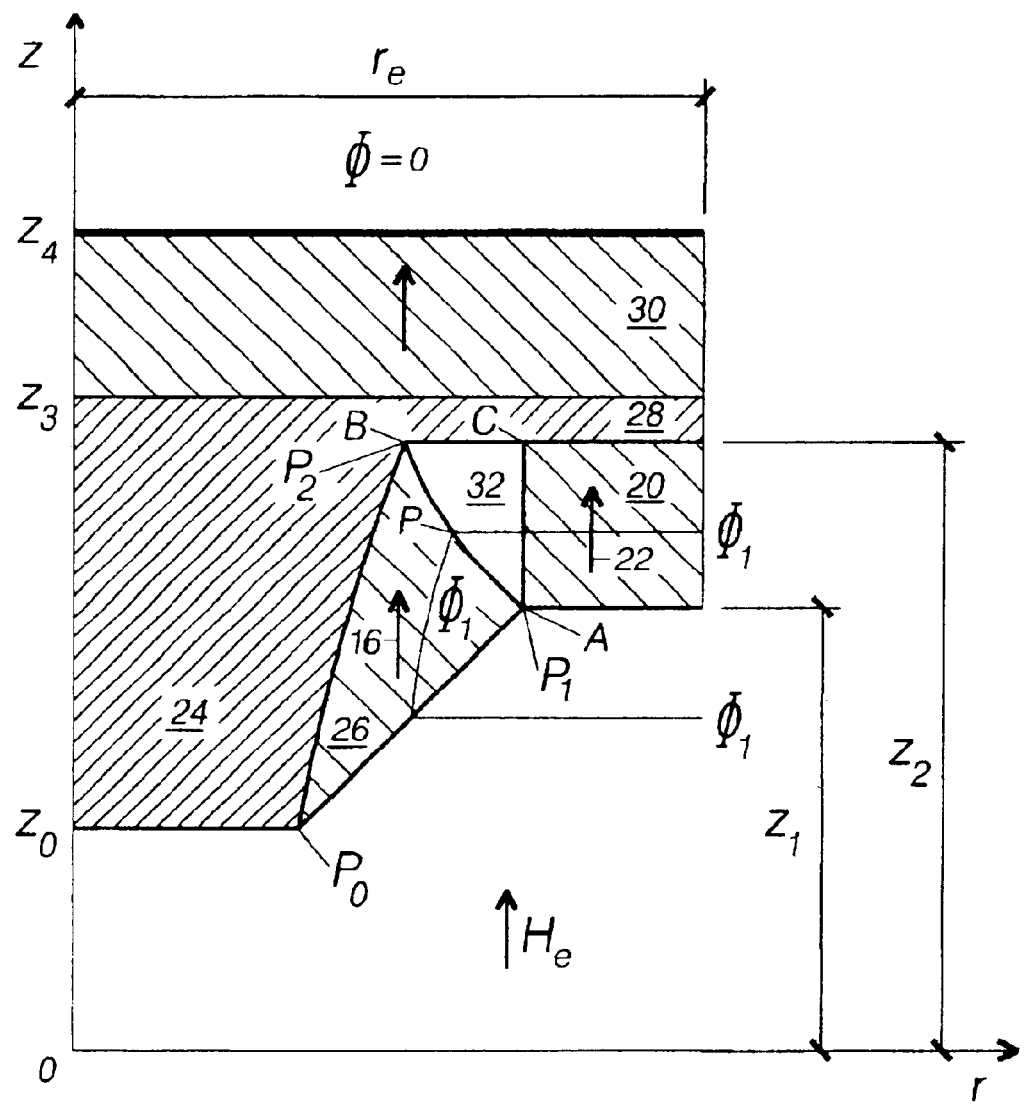
FIG. 4 is a cross-sectional view of part of another form of magnetic structure in accordance with the invention and FIG. 5 is a similar view with some typical dimensions indicated.

The next step in the development is to maintain the conical magnet shape but eliminate the magnetic material below $Z_0$ as shown in FIG. 3, and, as explained in the Appendix, provide an external termination of the conical body of magnetized material, which is accomplished by the transition from the conical magnetic structure 26 to an annular cylindrical structure 20 as illustrated in FIG. 4 (previously referred to as the additional first or inner permanent magnetic member). The latter has a common axis along the z-axis and is oriented with its remanence 22 also parallel to the z-axis. Other changes are necessary as indicated and explained in the Appendix. The inner now-truncated ferromagnetic conical section 24 bounds as before the magnetized conical section 26 with the remanence 16 also parallel to the z-axis. A horizontal extension 28 of the ferromagnetic section 24 separates the conical section 26 and the cylindrical section 20 from an additional outer cylindrical magnetized body 30 (previously referred to as the additional second permanent magnetic member) which extends over and around the whole structure including the not-shown left quadrant and the not-shown two quadrants below. A non-magnetic or empty space 32 separates the conical 26 and the cylindrical 20 sections. The uniform magnetic field in the non-magnetic space 32 is oriented vertically downward, opposite to the orientation of the field in the adjacent magnetic components 20, 26. The various symbols are explained in the Appendix.

Figure 5:
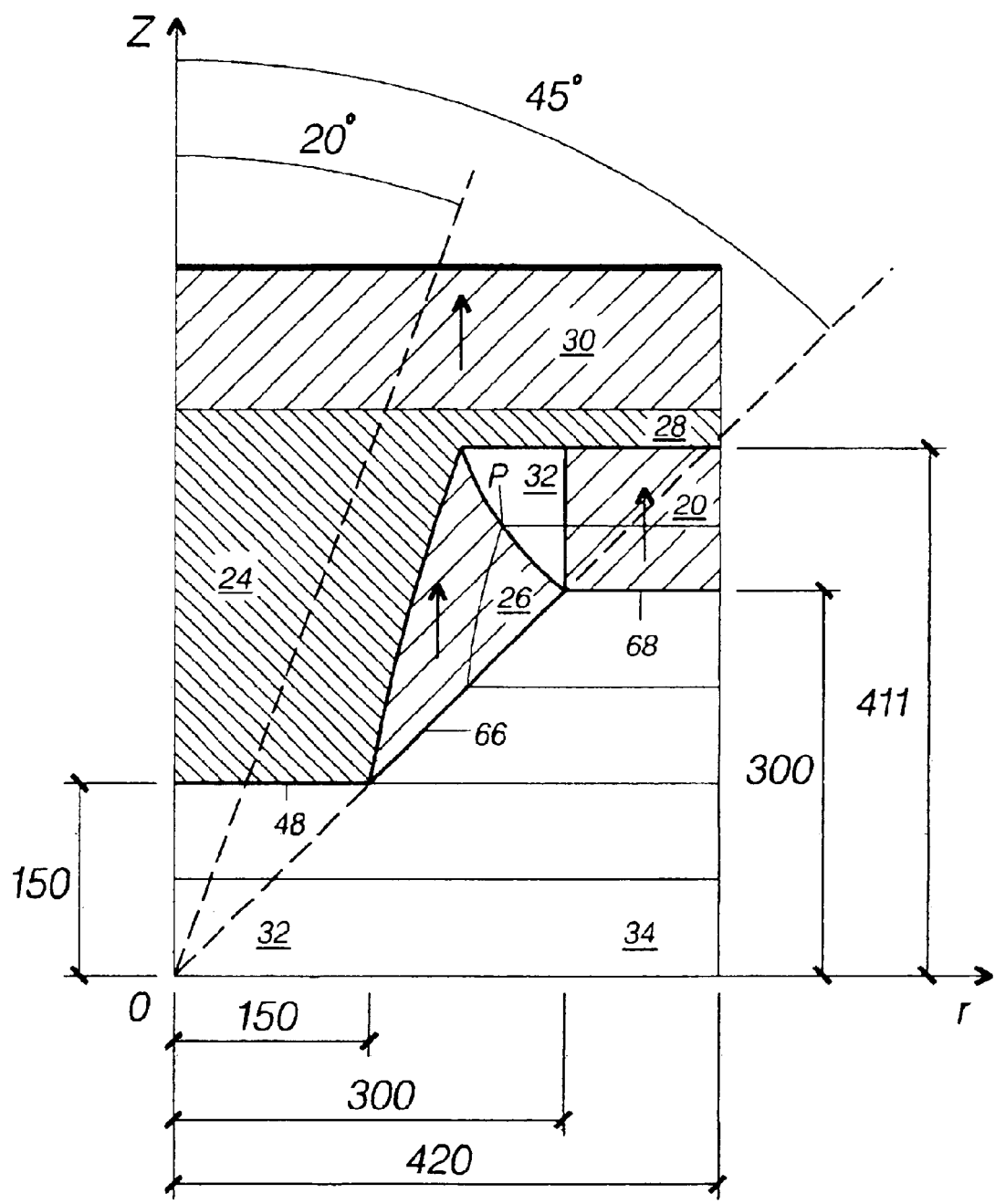

FIG. 5 illustrates the same structure with some typical dimensions in cm of the upper right quadrant to which the invention should not be limited. The angles 45° and 20° correspond to the half-angle $\theta_0$ and half-angle $\theta_1$. The space underneath the structure and thus between it and the corresponding not-shown structure beneath forms the cavity for receiving the patient. As will be noted, the cavity includes a smaller region 32 for accommodating the head of the patient, and a larger contiguous adjacent region 34 for accommodating the larger shoulders of the patient.

Figure 6:
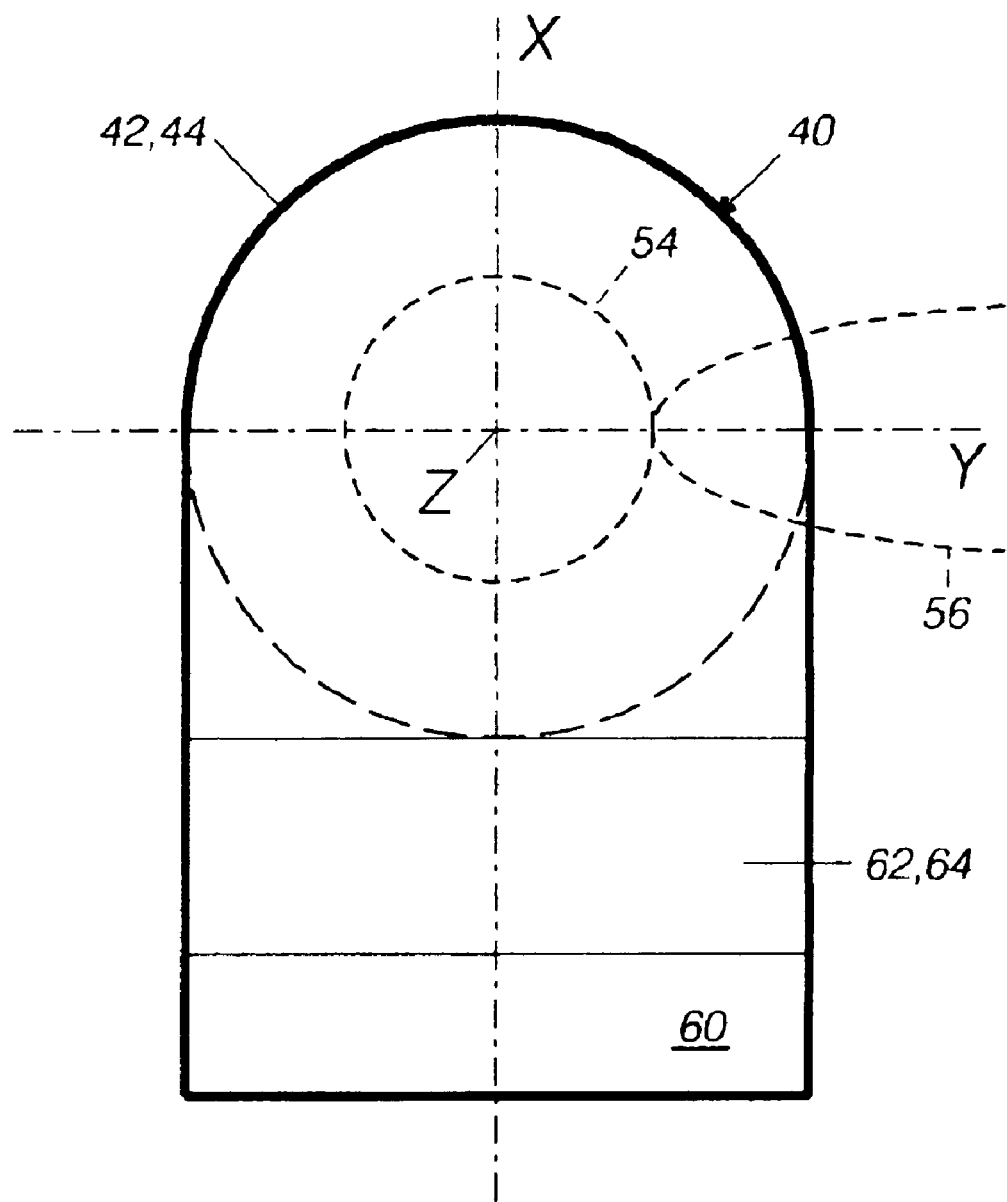
FIG. 6 is a top view of the full magnetic structure of which only one-quarter was previously illustrated and to which a yoke has been added. In this figure, a patient is schematically shown.
Figure 7:
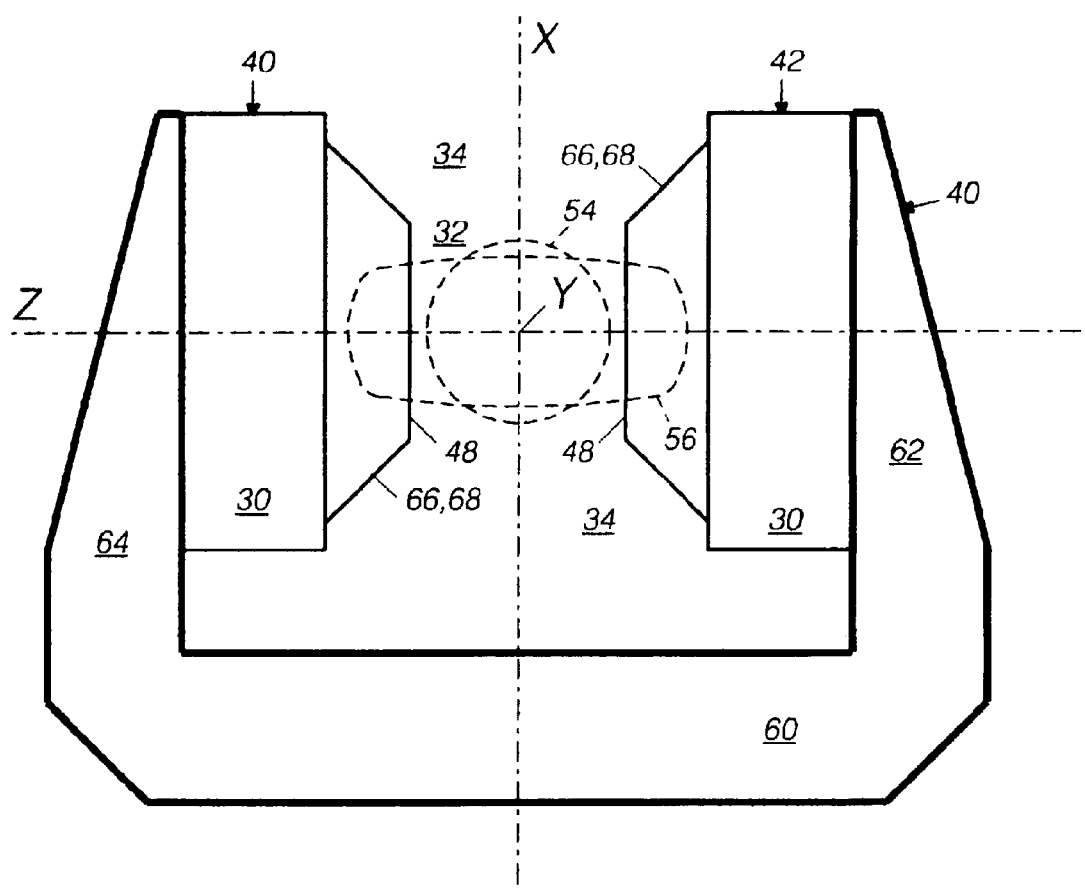
FIG. 7 is a side view of the magnetic structure shown in FIG. 6.

FIGS. 6 and 7 show, respectively, top and side views of a complete form of a preferred embodiment according to the invention indicated by 40. Looking first at FIG. 7, imagine that the structure illustrated in FIG. 5, rotated about the vertical and horizontal axes originating at the origin 0, are thus expanded to include both upper right (shown in FIG. 5) and left quadrants, to form a circular-symmetrical magnetic structure 42, spaced opposite to an identical structure 44 corresponding to the lower right and left quadrants. The cavity space between referenced 32 which is bounded by the bottom surfaces 48 of the inner ferromagnetic cores 24 (see FIG. 5) is the head cavity bordered on all sides by the larger shoulder cavity 34 bordered by the inner surfaces 66, 68 of the permanent magnetic components 26, 20. The head 54 and shoulders 56 of a patient lying on his or her back is illustrated by the dashed outline and extends parallel to the y-axis. The shoulders are behind the plane of the drawing. To the opposed symmetrical structures made up of the rotated quadrant illustrated in FIG. 5 has been added a conventional soft ferromagnetic U-shaped yoke with its bight 60 at the bottom and the two arms 62, 64 embracing the corresponding backs of the added cylindrical magnets 30. The z-axis in FIG. 6 is at the center perpendicular to the plane of the drawing, forming with the vertical x-axis and horizontal y-axis a rectangular coordinate system. The top view of FIG. 6 shows the circular symmetry about the z-axis of the main magnetic components 42, 44.

Figure 8:
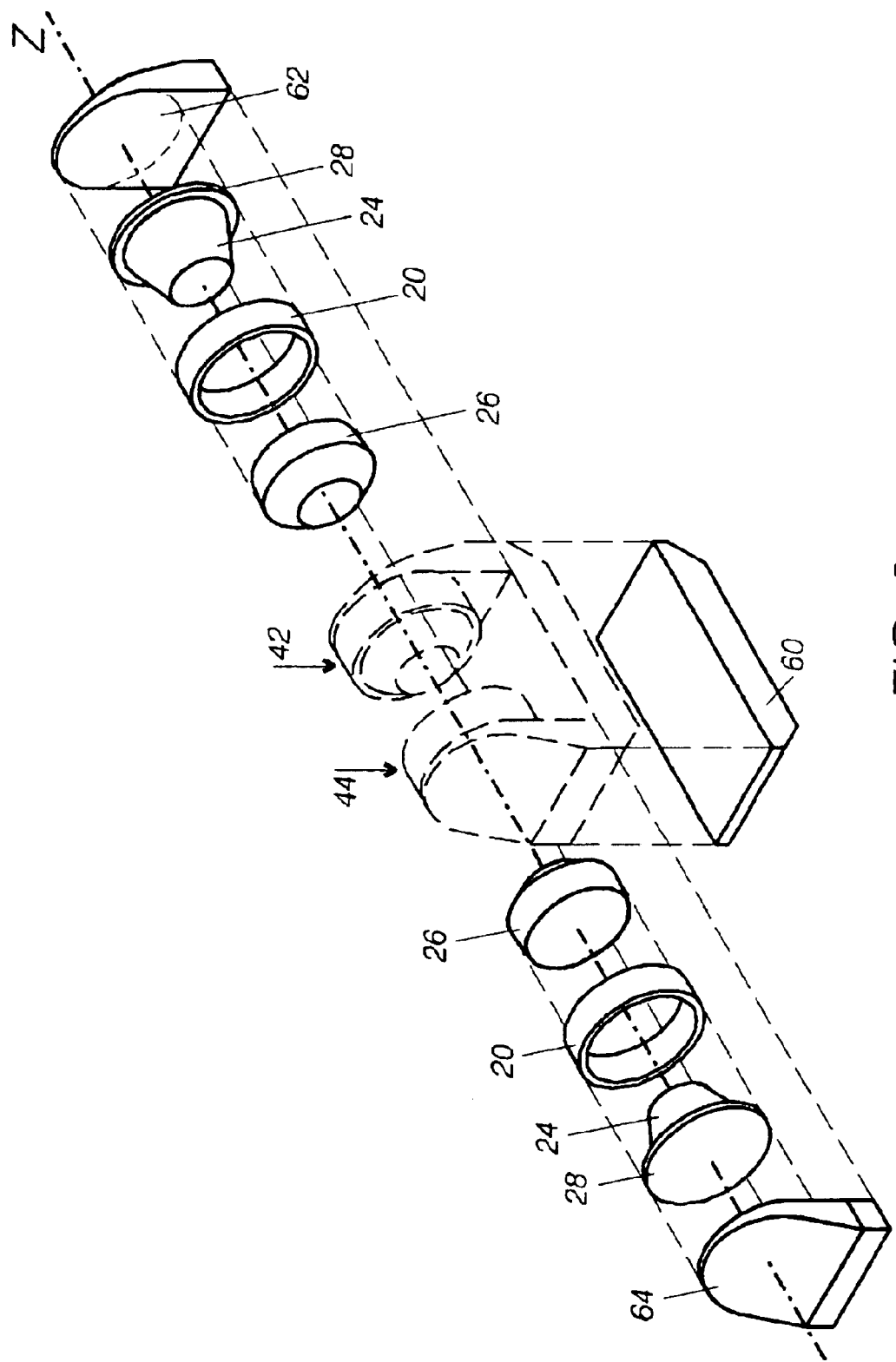
FIG. 8 is an exploded view of a magnetic structure similar to that of FIG. 7.
Figure 9:
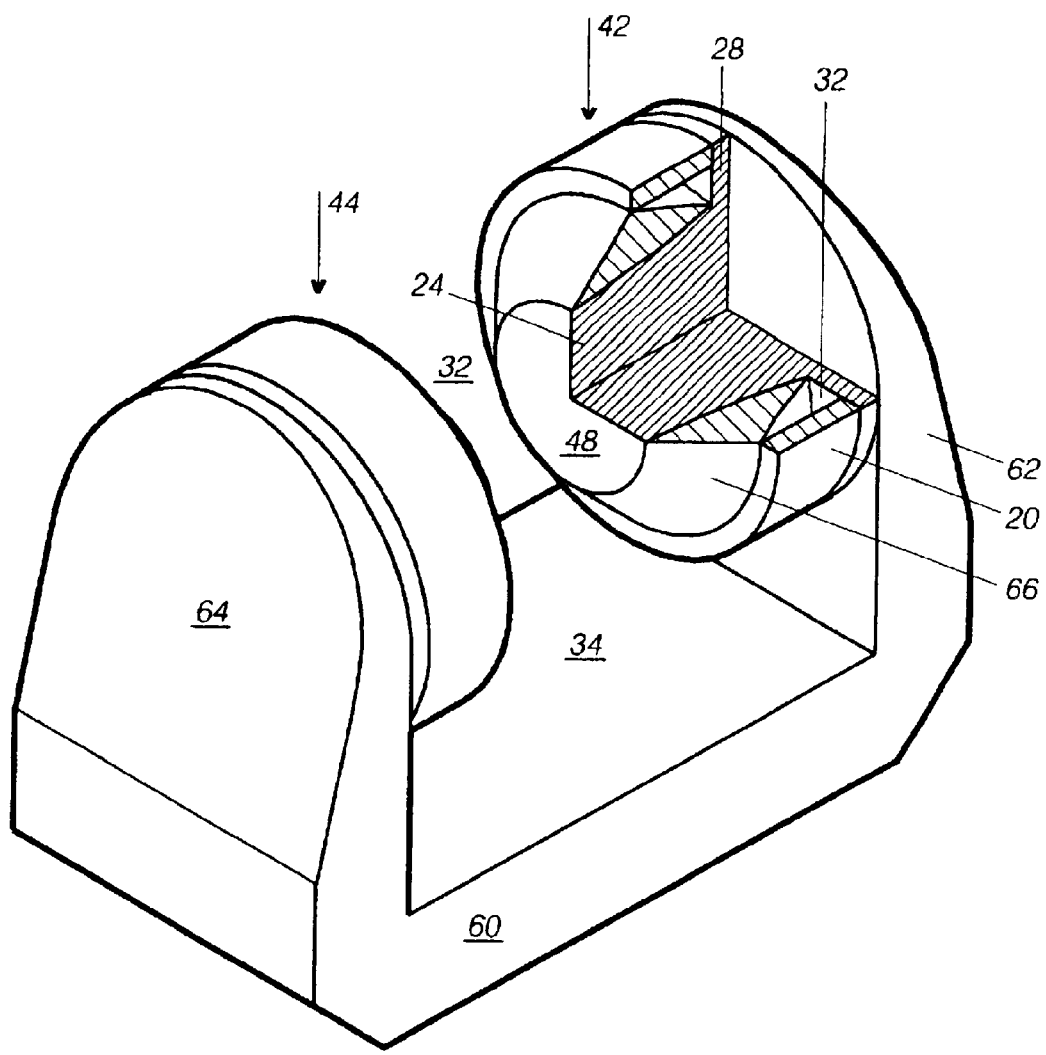
FIG. 9 is a perspective view of the FIG. 8 embodiment with one-quarter cut away to show the interior in part.

FIG. 9 is a perspective view of the structure of FIG. 7, and FIG. 8 is an exploded view. For simplicity, the additional cylindrical magnets 30 at the top and bottom have been omitted, but they have the same lateral extent as the adjacent lateral extension 28 of the high permeability core 24. The FIG. 8 view is depicted as if the whole structure 40 was lifted out of the yoke bight 60 and then exploded. The FIG. 9 embodiment shows one quadrant corresponding to FIG. 5 cut out and removed to show the inner construction. As will be observed, with the structure 40 lying on its base represented by the yoke bight 60, due to the symmetry, the patient can be introduced into the cavity from both sides as well as from the top, as the shoulder cavity 34 surrounds the smaller head cavity 32. The patient is positioned for head NMR imaging with its head inside the cavity 32 and its shoulders extending into the cavity 34. The object is to produce a magnet configuration that will generate a uniform imaging field in a region of interest surrounding the patient's head 54, the magnetic field having an intensity $H_0$ ($H_e$ in the Appendix) along the z axis in FIG. 7.

The intensity $H_0$ is related to the remanence J of the conical magnetic material by the equation:

$$K=(\mu_0 H_0)/J,$$

where $\mu_0$ is the magnetic permeability of a vacuum and K is a design parameter which is a function of the dimensions z of the structure as shown in the Appendix.

The dimensions in centimeters shown in FIG. 5, which are otherwise to scale, are only exemplary, and indicate representative values for one magnet design for a value of K=0.426, which would correspond to a uniform field in the imaging region of:

$$(\mu_0 He) \sim 0.55 \text{ Tesla, for } J \sim 1.3 \text{ Tesla.}$$

In the implementation illustrated in FIGS. 6–9, the magnetic structure is open from all sides except for the yoke base side to allow access to the surgical area. This opening usually introduces a distortion of the uniform field in the imaging region that must be partially corrected to bring the field variation within acceptable limits, typically within 10 ppm. This correction is part of the tuning or shimming of the magnet that compensates the distortion induced not only by the opening but also by the magnetization and fabrication tolerances.

Figure 10:
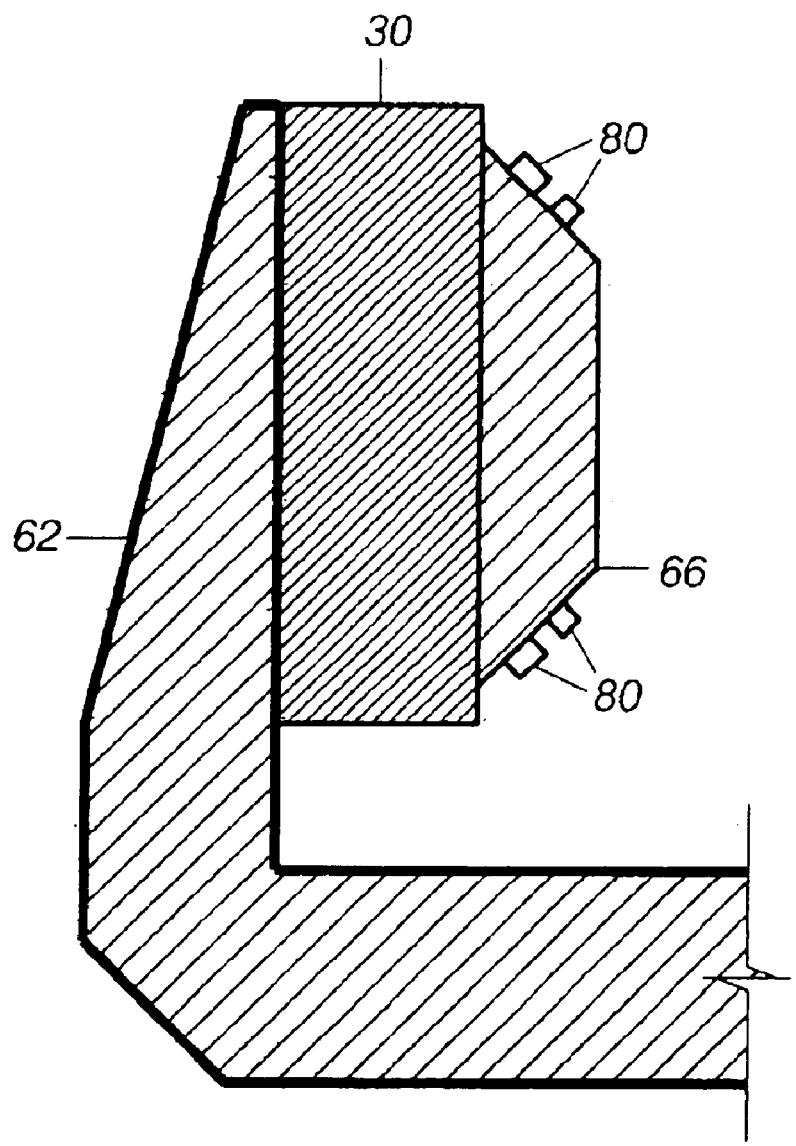
FIG. 10 is a schematic cross section of part of the magnetic structure of FIG. 7 illustrating the location of one form of a filter structure to compensate field distortions.

One way to accomplish the tuning of the magnet is by means of a filter structure assembled on the inner magnetic structure surfaces 48, 66, 68 as described in detail in one of my publications entitled "Linear Theory of Pole Piece Design in Permanent Magnets", published in the Proceedings of the Thirteenth International Workshop on Rare Earth Magnets and their Applications, Sept. 11–14, 1994, Birmingham, United Kingdom, whose contents are incorporated by reference in this application. This paper explains that the design of a suitable filter structure is the result of a linear theory of pole pieces developed by the author, in which the imaging region is assumed to be confined in a cylinder whose axis contains the imaging center and is perpendicular to the pole pieces. The cylinder is closed by the surfaces of the two pole pieces that act like reference surfaces of the magnetostatic potential. This potential generated by the magnet inside the cylinder is expanded in cylindrical harmonics as shown by equation 22 in the referenced paper in which the symbols have the meanings indicated in the paper and therefore do not need repeating here. In that equation, the first term on the right hand side is the uniform field, and the other terms are the harmonics of the field distortion corrected by the filter structure as described in that paper. These harmonics are eliminated if the sections of the filter are polarized with a dipole moment that satisfies equation 24 of the paper. As will be observed from the paper, the series of the field distortion converges rapidly and, as a consequence, only the lower order harmonics have to be compensated. The system of FIGS. 6–9 can be compensated by concentrating on the inner surfaces 48, 66, 68 of the structure bounding the cavities 32, 34 a suitable distribution of correcting dipole moments in magnets. Specific examples of filter design suitable for this application can be found in the paper and in my issued U.S. Pat. Nos. 5,475,355 and 5,495,222, whose contents are incorporated by reference in this application. One form of active filter structures are thin sandwiches of outer soft ferromagnetic plates bounding the cavity, magnetically isolated from the supporting magnetic structure, with a permanent magnetic insert or inserts between the plates. They can be located in accordance with the principles enunciated in the paper along the cavity-bounding interior surfaces to reduce or minimize field distortion. The filter structures typically tend to be positioned in the vicinity of the region of interest. FIG. 10 illustrates schematically one possible filter structure 80 on the conical surfaces of the structure, shown as several discrete or annular members made up of ferromagnetic and magnetized material which have the necessary magnetic properties and are distributed such as to compensate for field distortions as described in the referenced paper and patents.

The region of interest would typically be a spherical region or a region approximating a spherical region within the cavity, centered (for example, at z=0, y=0) where the geometry is symmetrical at a position where the degree of uniformity is acceptable, as explained typically a uniformity that does not vary by more than about the 10 ppm over the whole of the region of interest.

Those skilled in the art will appreciate that the invention is not necessarily limited to structures with the dimensions indicated in the drawings, which are only to illustrate the size of a particular embodiment. The preferred geometry illustrated can be replaced by other geometries following the principles described herein. In particular, the half-angle $\theta_0$ and half-angle $\theta_1$ are not limited to the two values given in the preferred embodiment. Those values are preferred because they represent a good practical compromise among factors such as the overall size of the unit, the volume of magnetic material required, the magnetic field intensity, and the patient's accommodation. For example, increasing $\theta_0$ (for example, $\theta_1=20°$, $\theta_0=50°$, for K=0.55) increases the structure's size, requires more magnetic material, and may undesirably reduce the patient's cavity, though it will also allow a higher field intensity ($\mu_0$ He)~0.71 Tesla with the increased magnetic material. Keeping $\theta_0$ at 50°, but increasing $\theta_1$ to 30°, for example, likewise may also require more magnetic material but with a K=0.36 will result in a smaller field intensity ($\mu_0$ He)~0.47 Tesla. Reducing both angles will likely produce too narrow a practical structure with inadequate patient space. These other geometries are also considered within the scope of the invention. It will also be understood that the patient may be rotated about the y axis within the magnetic structure in order to allow the surgeon to access different sides of the brain.

A number of important advantages flow from the configurations of the invention, which include: an overall smaller structure size requiring less magnetic material while maintaining a high field intensity, accomplished with a structure that is considerably simpler than alternative structures.

To reduce dimensions and weight (very important when the structure is to be used in a surgical suite), the space between the body and the magnetic structure should be reduced to a minimum compatible with the design requirements of the structure bearing in mind the stringent requirements of field uniformity in the imaging region. Due to the close proximity of brain and shoulders the field uniformity must extend to the neck and shoulder region, though the field uniformity need not be quite as stringent in the neck and shoulder region.

Those skilled in the art will also appreciate that the invention is not limited to the specific shape of the yoke, and other geometries are also considered within the scope of the invention so long as saturation is avoided.

The preceding description is of the embodiments disclosed in the second related application. The description following applies to the new embodiments that include the improvements described earlier.

Figure 11:
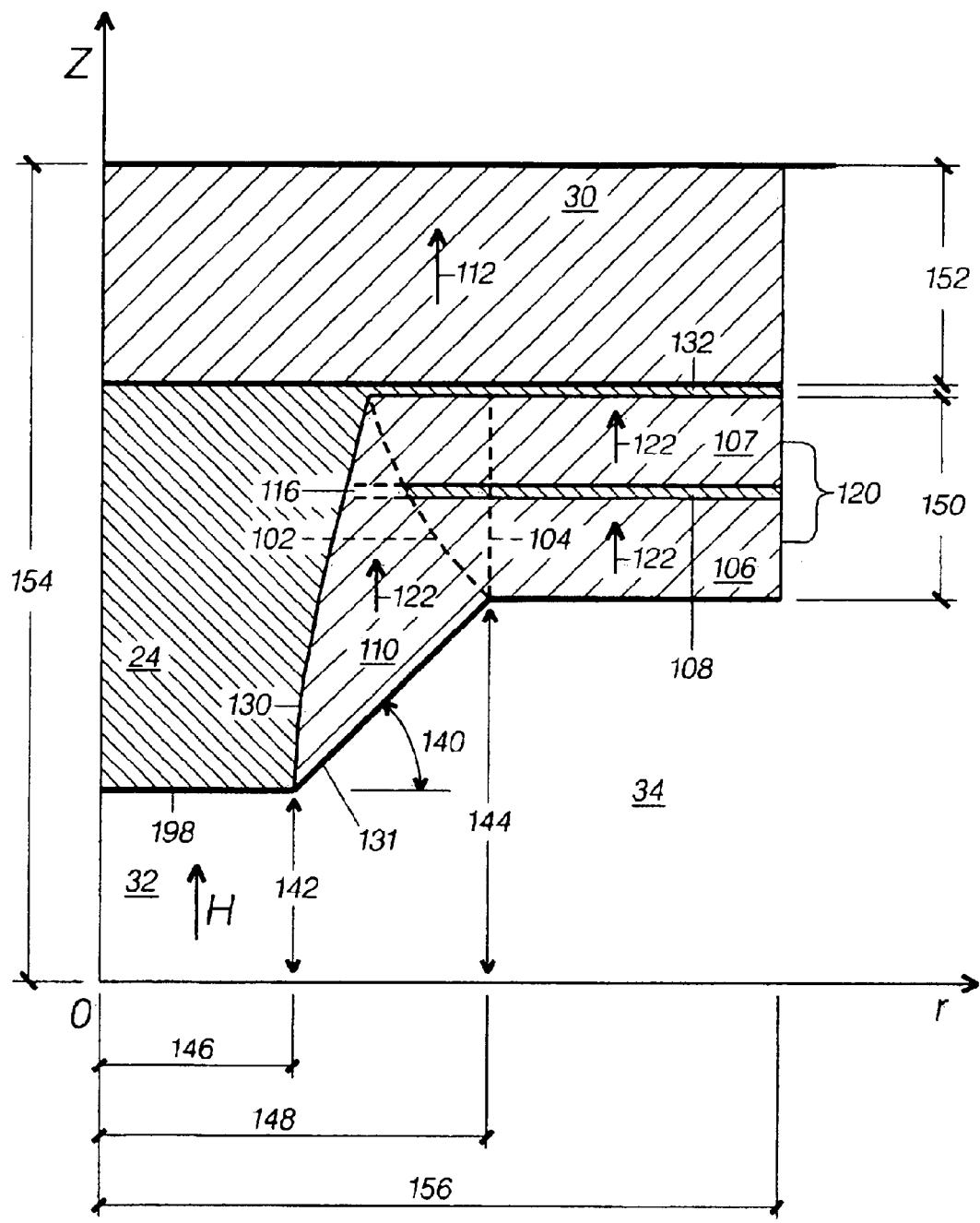
FIG. 11 is a cross-sectional view similar to that of FIG. 4 of part of one form of magnetic structure in accordance with the present invention.

FIG. 11 is a cross-sectional view similar to that of FIG. 4 of one form of improved magnetic structure for NMR imaging of the head. For purposes of clarification, to show more clearly how the improvement relates to the embodiment of the second related application, several dashed lines 102 and 104 have been added to FIG. 11. Dashed line 102 corresponds to the curved concave line AB of FIG. 4 that represents the far annular surface of the conical magnet 26, remote from the apex represented by point $P_0$, and that separates that annular surface from the adjacent non-magnetic space 32 shown empty in FIG. 4. Dashed line 104 corresponds to the vertical straight line AC of FIG. 4 that represents the inner annular surface of the first or inner cylindrical magnet 20 (FIG. 4) and that also bounds the opposite side of the non-magnetic space 32. The latter is the non-magnetic element 32 with the triangular cross-section referred to earlier in which the field direction is anti-parallel to that within the cavities.

A principal feature of the improvement of the present application is to reconfigure the permanent magnetic structure in order to improve the field uniformity within the head and shoulder cavities. This is accomplished in accordance with a feature of the invention by extending laterally inwardly the inner cylindrical magnet (referred to as 120 in FIG. 11) substantially to fill or greatly reduce that non-magnetic region (32 in FIG. 4) with magnetic material having the same direction of remanence 122 as that 22 of the outwardly-extending inner cylindrical magnet 120 up until the imaginary dashed line 102. Put another way, the far surface of the conical magnet 110 is extended upwardly and outwardly to meet the adjacent inner cylindrical magnet 120. Since the latter is no longer completely cylindrical as now the dividing line between the conical magnet and the inner cylindrical magnet 120 has become blurred or unclear, the description here and in the claims refers from time to time to an "essentially cylindrical magnet", meaning that the structure 120 still behaves mainly as if it were a simple cylindrical magnet and can be so treated in the design analysis. The resultant configuration corresponds to that disclosed in FIG. 3.1 of the Appendix.

These kinds of magnetic structures employing conical and cylindrical magnets and designed to produce a uniform field in a region of interest capable of providing NMR imaging provide best results when the remanences of the conical 110 and cylindrical magnets 120 are oriented in the same direction, parallel to the longitudinal axis Z of the structure. However, this may introduce distortions in the uniform field due so-to speak to the non-matching magnetic interface between the adjacent surfaces of the conical magnet and the inner cylindrical magnet (designated schematically by dashed lines 102 and 104). The present invention deals with several preferred embodiments which allow closer coupling of the adjacent surfaces of the conical magnet and the inner cylindrical magnet without significantly impairing the field uniformity and in some cases actually improving the field uniformity.

One possible solution according to the present invention is to replace the triangular non-magnetic region 32 of FIG. 4 with magnetic material having a value of remanence approximately twice that of the conical magnet 26 of FIG. 4 and having the same orientation. This is less preferred because it reduces the active field. The reason is that, if the choice of material for the replaced triangular 32 section is chosen to provide the greatest remanence, it means that the remanence of the conical section will be much lower, resulting in the smaller field intensity.

Figure 12:
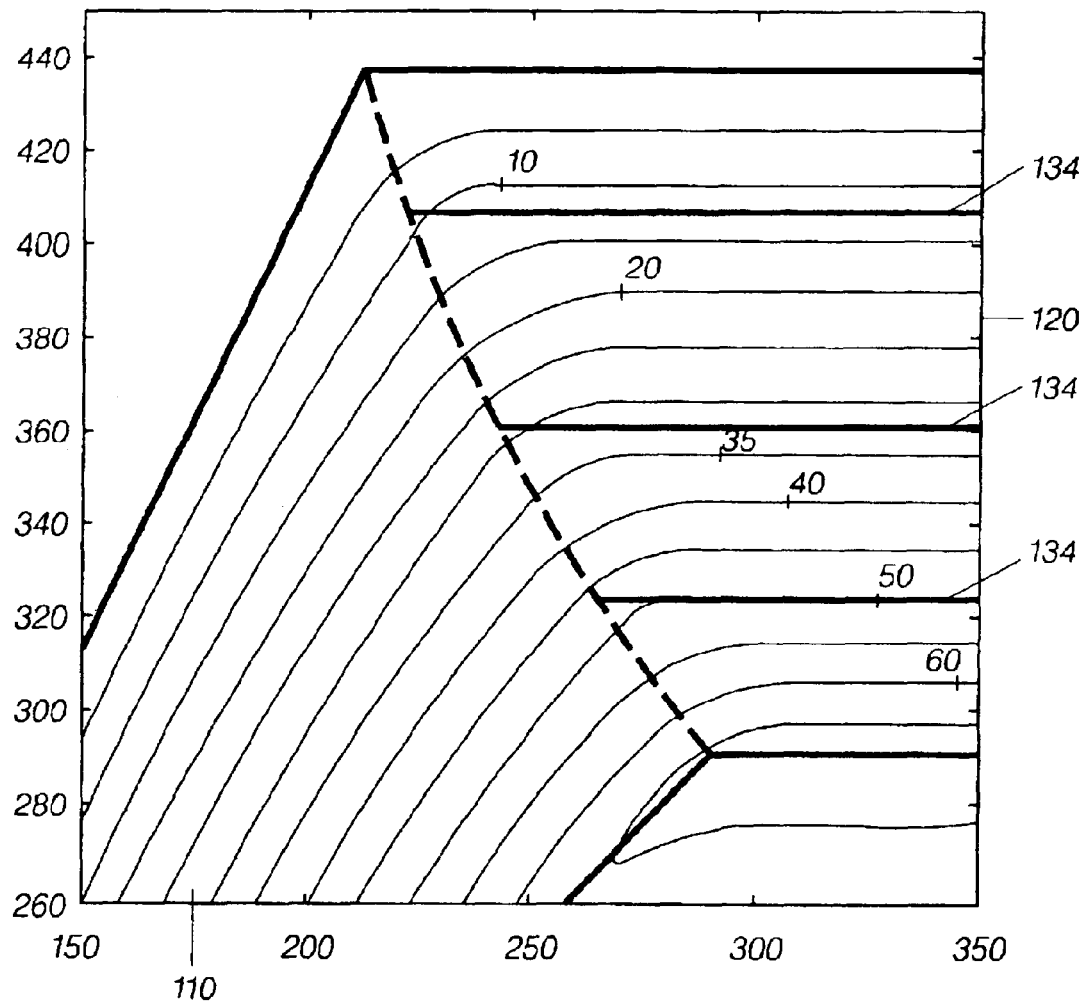
FIG. 12 is a schematic view of another form of magnetic structure in accordance with the present invention.

A preferred embodiment is for the inner cylindrical magnet 120 to maintain the higher value of remanence, the same as that of the conical section, but preferably is divided horizontally into at least two segments 106 and 107 separated by a magnetic strap 108, which, as described earlier, is a thin high permeability layer, only thick enough to prevent saturation, that forces the facing contacted surfaces of the inner cylindrical magnet segments 106, 107 to follow equipotential lines or surfaces. Note that the strap 108 terminates at the imaginary curved line 102, still leaving a small non-magnetic region 116 separating the inner strap end from the inner conical surface 130. This is the preferred structure depicted in FIG. 11. Otherwise, the curved line extending between $P_0$ and $P_2$ in FIG. 4 is essentially similar to the same curved line 130 in FIG. 11, and the curved line AB in FIG. 4 is essentially similar to the curved dashed line 102 in FIG. 11. The thin laterally extending ferromagnetic strip 132 in FIG. 11 corresponds to that designated 28 in FIG. 4 and functions as a magnetic strap. Another way of viewing this embodiment compared to that of FIG. 4 is as a virtual integration of the conical magnet 110 and the inner cylindrical magnet 120 to form nearly a single structure with the same vertical remanence 122, orientation as well as magnitude, leaving still a smaller non-magnetic region 116 and for best results requiring at least one strap 108 preferably located midway inside the inner cylindrical magnet 120. Nevertheless, the overall result is for improved field uniformity in the region of interest, which as before is generally a sphere whose center is at the origin O within the smaller cavity 32. As a further alternative, several evenly spaced parallel magnetic straps 134 can also be employed as illustrated schematically in FIG. 12. Not shown in FIG. 12 are the small non-magnetic sections that preferably separate the ends of the straps from the inner surface of the conical magnet. FIG. 12 also shows some of the equipotential lines in such a structure. The abscissa and ordinate in FIG. 12 are in cm. The thicker line at the top of FIG. 11 symbolically represents the yoke shown more clearly in FIG. 7.

It will also be observed that the inner conical surface, 130 in FIG. 11, is not a perfectly straight line. Nevertheless, for present purposes, it can properly be described as a surface of a conical structure and will behave essentially the same as if it were perfectly straight.

The overall configuration of the FIG. 11 embodiment, including its conical angle 140 formed as shown between the outer conical surface 131 and a plane perpendicular to the z direction, its cavity dimensions 142, 144, 146, 148, the height 150, 152, and the overall height 154 and width of the quarter section illustrated in FIG. 11, can be similar to that given in FIG. 5. Some dimensions will vary to achieve best operation, as is common with these designs. Following the principles enunciated in the Appendix will enable the person of ordinary skill in the art to devise a structure adequate for his or her intended purpose. The strap dimensions are kept as thin as possible to avoid saturation. A thickness of 10 cm should prove adequate for most purposes.

Figure 13:
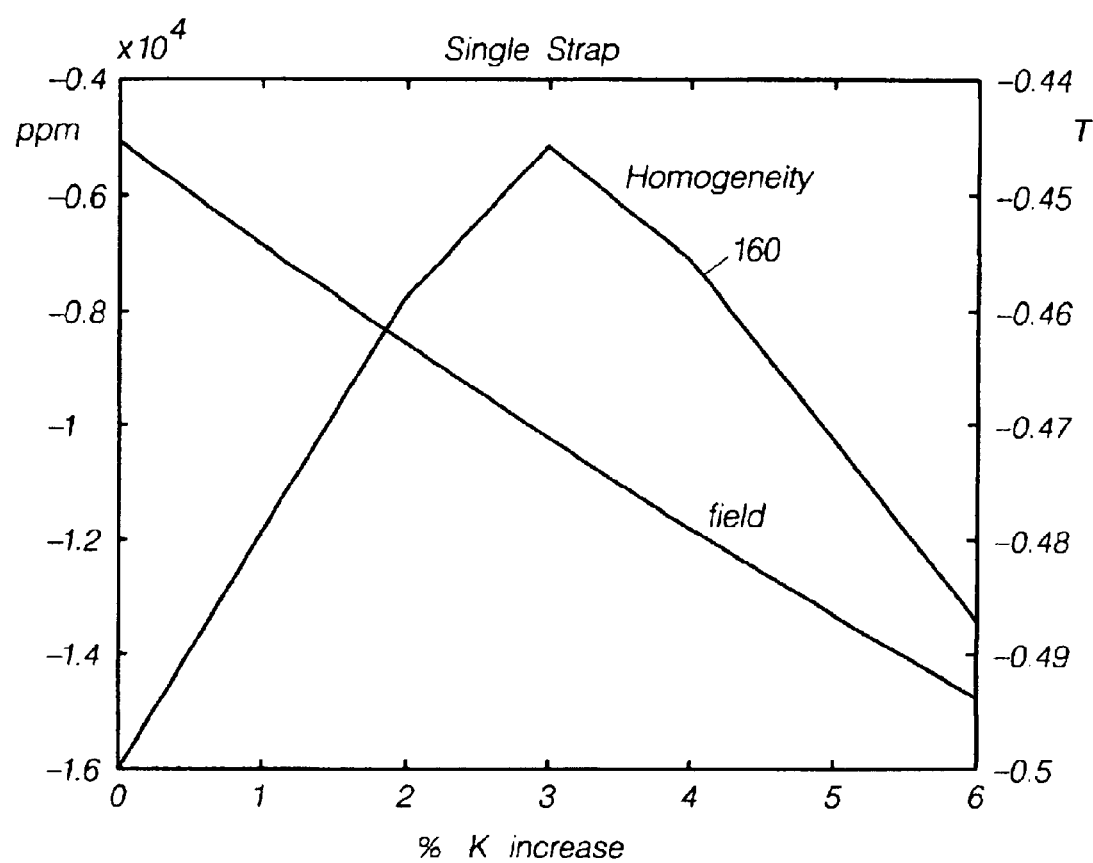
FIG. 13 is a graph of the field homogeneity and field intensity in the cavity as a function of increases in the design factor K, indicating a method for optimizing these magnetic properties.

As explained in the Appendix, when a series of computation are conducted of the field intensity in the region of interest and its variation over the region of interest for different values of K, it was unexpectedly discovered that a small adjustment in K can result in an improvement of uniformity, illustrated in FIG. 13 for the embodiment of FIG. 11 with a single strap. When the variation in field intensity in ppm is plotted against the values of K, a curve 160 results that peaks at a slightly increased value of K. The value of the field in Tesla for that value of K is not significantly less than that for the nominal value. Best results are achieved at a K value increased by about 3%. The number may be somewhat different for other nominal K values but, interestingly, is typically higher by a few percent.

A feature of the invention is a design method which takes advantage of this phenomena. Normally, a nominal value of K is chosen determined by the magnetic materials that will be used and the field intensity wanted in the region of interest. For example, where $J_0$ is chosen equal to approximately 1.3 T, and the nominal value of K chosen is about 0.49, then $\mu_0 H_0$=0.64 T. The next step is to perform a series of computations measuring the field uniformity and field intensity as K is varied over, say, a range of 1–.1.6. A graph similar to that of FIG. 13 should result, and the designer can then chose that increased value of K that provides the desired uniformity and field strength. Generally this will be a value of K several percent higher than the nominal value. To implement this design feature requires a small reconfiguration of the magnetic structure. For example, K can be increased by increasing H, obtained by increasing the amount of magnetic material present in the structure, such as by increasing the thickness of the cylindrical magnet 30. In addition, a magnetic material from the same family but with larger remanence can be chosen to maintain the same field intensity H. Since the increase wanted of K is small, only a small change in the configuration is necessary to obtain the benefits of this aspect of the invention. Other ways of increasing K will be evident to those skilled in this art.

Figure 14:
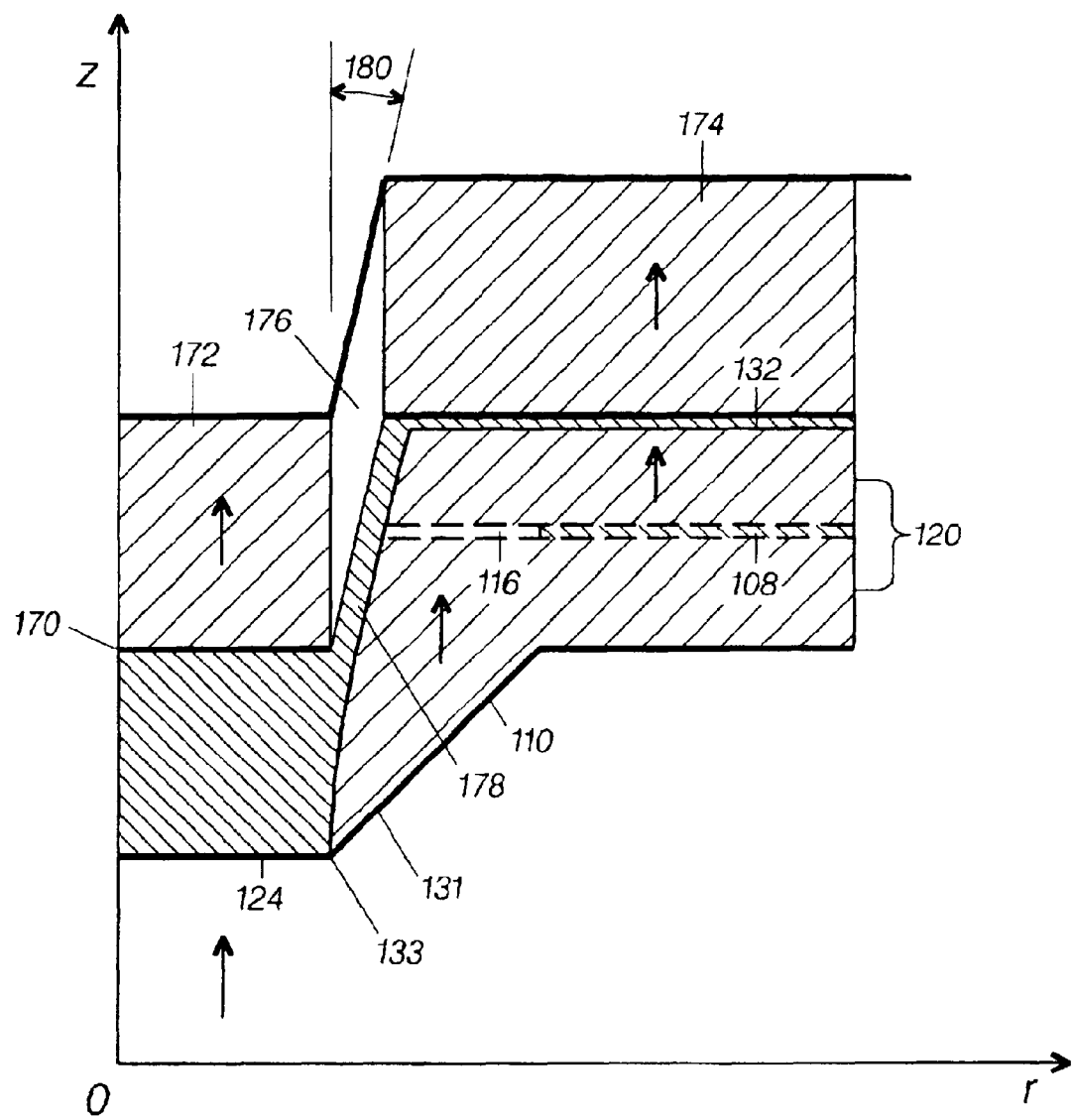
FIG. 14 is a cross-sectional view similar to that of FIG. 11 of part of another form of magnetic structure in accordance with the present invention.

A modification of the external magnet may be adopted in the design of the structure of the invention in accordance with another feature of the invention, for the purpose of reducing the weight of the magnet, as shown in FIG. 14. The hollow geometry of the inner ferromagnetic pole piece 124 is recessed 170 to receive and house part 172 of the magnetized material of the outer cylindrical magnet which extends over the center as shown, the remaining part being designated 174 and being separated by a non-magnetic region 176 having a trapezoidal-cross-section. The thickness in the Z direction of the two cylindrical parts 172, 174 of the outer cylindrical magnet can be about the same as that in the FIG. 11 embodiment. The angled extension 178 joining the pole piece 124 with the strap 132 functions similarly to a strap. The thickness of the reduced pole piece can be determined by design or by trial and error. The angle indicated by 180 will typically be close to that of the inner conical surface of the conical section 110. The result is that part of the space previously occupied by the ferromagnetic pole piece is now occupied by the external magnet. Hence, overall, the size and weight of the structure is reduced. This can be of great importance, since these structures intended for human use are very large and, since magnetic material is intrinsically heavy, the entire structure can weigh several tons. Structural variations that reduce size and weight can be important for certain applications. However, the field in the region of the external magnet becomes more non-uniform thereby reducing the efficiency of transfer of the energy stored in the external magnet into the energy of the magnetic field generated by the magnet. Hence, one can expect that with the saving of some weight of the ferromagnetic component of the magnet there will result a reduction of the field strength in the region of interest.

I described above the uniform field distortion problems arising from the finite dimensions of a practical magnet and by the fabrication tolerances of the geometry and distribution of the magnetization. The distortion due to the effect of finite dimensions can be at least partially compensated in the design phase by modifying the value of K of the external magnetic structure as described above, but the distortion due to fabrication tolerances cannot be compensated in the design phase and requires another approach. Several of my earlier patents have proposed compensation schemes for different magnetic structure geometries involving the judicious placement of magnetic dipoles about the structure. For example, U.S. Pat. No. 5,055,812 describes compensation means for a yokeless permanent magnetic structure; U.S. Pat. No. 5,428,333 also describes different compensation means for a yokeless permanent magnetic structure. Those compensation schemes however are best suited for the conical geometry that characterizes the present invention.

In accordance with another feature of the invention, a compensation scheme for the conical magnetic structure geometries described herein comprises the judicious placement of magnetic dipoles about the structure based on principles different from the principles used in the referenced patents. As described in more detail in Section 4 of the Appendix, the compensation shimming is performed by means of a distribution of magnetic dipoles on the outer conical surface 131. Preferably, the magnetic dipoles are in the form of axially-spaced discrete rings or annular elements. The location of the magnetic dipoles, and their magnitude and orientation are determined by following the methodology described in great detail in the Appendix. Briefly, the shimming method of the invention requires the following steps:

1. Assemble the entire conical magnetic structure as described above. Preferably, but not necessarily, the magnetic structure is designed to incorporate the adjustment in K to compensate for the effect of finite dimensions.

Figure 15:
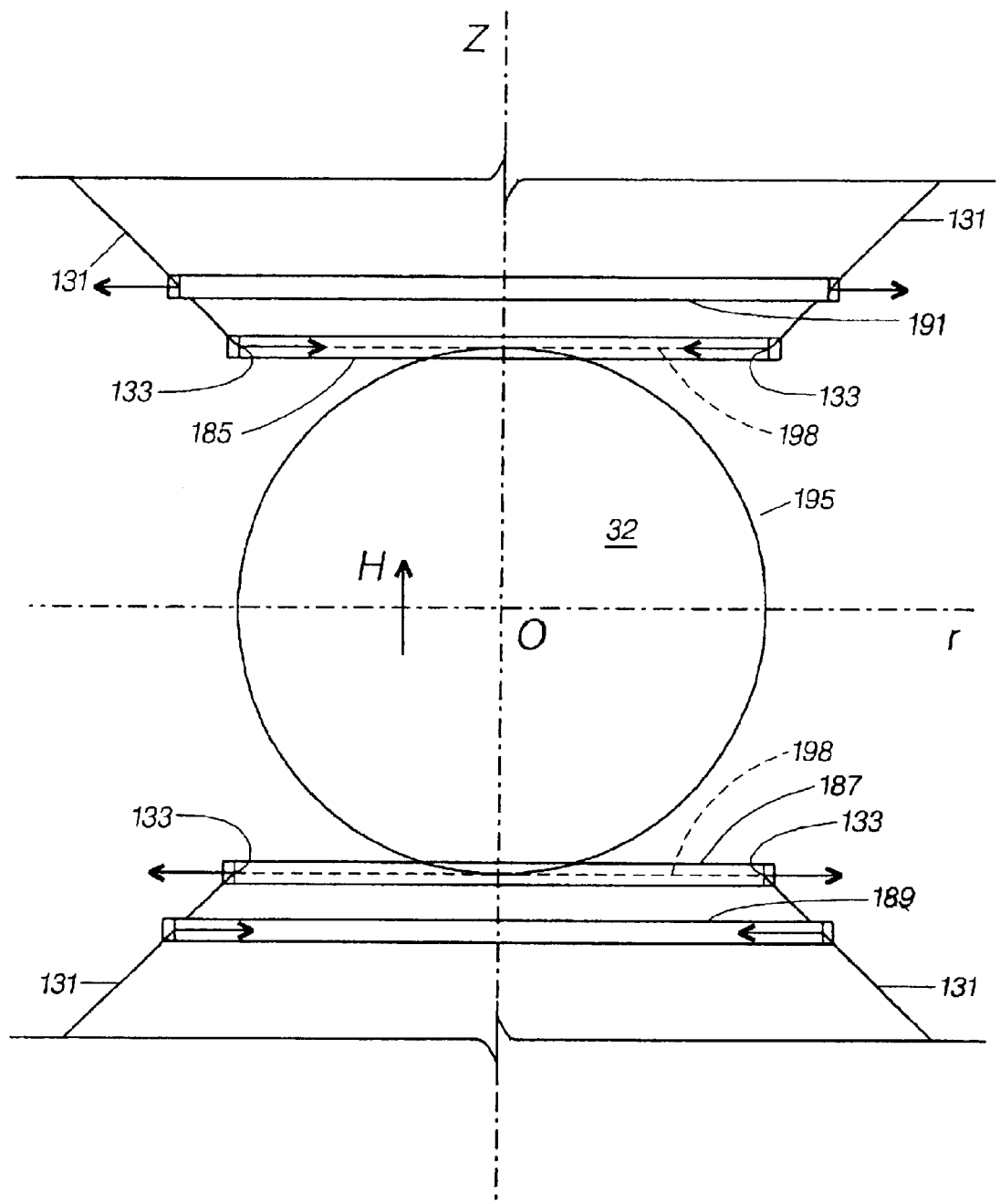
FIG. 15 is an enlarged view similar to a permanent magnetic part of FIG. 7 illustrating a novel shimming technique in accordance with the present invention.

2. Measure the magnetic field uniformity over a reference sphere 195 (FIG. 15) having an origin at the structure center and preferably reaches to the bottom of the opposed center elements whose surfaces 198 bound the cavity 32 and includes the region of interest. This measurement essentially maps the field intensity over the reference spherical surface. Non-uniformities representing distortions of the desired uniformity will typically be present.

3. Choose the number of compensation rings to be employed. The number typically will be at least two or three. The rings of permanent magnetic material are dimensioned to surround and contact the conical surfaces 131. The rings, if more than one, lie in parallel planes and are axially spaced, i.e., in the z direction, and thus will necessarily have different radii. The plane of the rings, preferably, is perpendicular to the z axis. If more than two rings are chosen, then their axial spacing is preferably equal. The effect of the rings depends on their closeness to the region of interest. Thus, preferably a first ring is placed on the outer conical surface 131 at its bottom vertex 133 with its lowermost surface coincident with the cavity-bounding surfaces 198. If a second ring is used, it preferably is placed a short distance above or below the first ring on the outer conical surface. The ring axial spacing is not critical except they should be located close to the region of interest. Their magnetization is determined as will be explained below.

4. Magnetize the rings such that when positioned on the conical magnet, the orientation of their remanence is radial and perpendicular to the z axis, i.e., parallel to the r axis in the figures. It is understood that pairs of rings are preferably used so that a ring on the upper conical section is matched by a ring on the lower conical section and arranged symmetrically to one another. The rings are preferably always magnetized in anti-parallel relationship such that when the first or lowermost ring on the upper cone is magnetized radially inwardly, its counterpart on the opposite cone (lower cone in the figures) is magnetized radially outwardly, and the next or second ring on the upper cone is also magnetized radially outwardly, and so on. Thus, an inverted magnetization relationship is maintained among the rings.

5. The configuration of the rings, i.e., their magnetizations and orientations, are determined by computing the system of equations defined by equations 4.12 and 4.13 of the Appendix, whose terms are defined by the previous equations 4.1–4.11, using the field mapping obtained in step 2, i.e., without the rings present.

6. Place the first ring on the outer conical surface 131 at its preferred location at the bottom vertex 133 and if used the other rings as described.

7. Re-measure the magnetic field uniformity over the same reference sphere having an origin at the structure center and co-spherical with the region of interest. Typically, a relatively coarse compensation will result from the presence of the compensating rings.

8. Re-compute the system of equations defined by equations 4.12 and 13 of the Appendix, whose terms are defined by the previous equations 4.1–4.11, using the new field mapping obtained in step 7 with the rings present.

9. Reconfigure the ring or rings in accordance with the new computations obtained in step 8 compared with that obtained in step 5 to adjust the dipole distribution to reduce the distortion and reassemble. When the uniformity is now re-measured with the reconfigured rings in place, typically, an improved compensation will result, and the process can be repeated until the desired value of uniformity is achieved.

Reconfiguring the rings to improve uniformity can be done in several ways:

a) re-construct and magnetize the first and any other rings present using a material of greater or lesser remanence to increase or decrease the magnetization and reassemble and re-measure to determine whether the effect is better or worse;

b) add a second or third or more rings, and re-measure to determine whether the effect is better or worse. In general, the more rings used, the greater the field uniformity but at the expense of a small reduction in field intensity. Further adjustments can be obtained by repositioning either or both of the rings, or increasing or decreasing the radial or vertical thickness of the rings. However, they should preferably always remain vertically spaced from one another.

The dimensions of the ring or rings are not critical. Typical radial and vertical thicknesses can vary between about 1–5 cm. It will be observed that when more than one ring is employed, then they will necessarily have different inside and outside radiuses. In all cases, the planes of the rings are perpendicular to the cone axis and parallel to the bottom surface of the inner ferromagnetic core.

In general, shimming rings will preferably be placed on both the upper and lower conical sections at corresponding locations, and the orientation of magnetization of the rings at their corresponding locations will be chosen to be anti-parallel. For instance, in the preferred embodiment of FIG. 15, the first ring 185 located at the bottom of the outer conical surface of the upper cone is magnetized radially inwardly, that is, the N pole faces inwardly and the S pole faces outwardly. Conversely, the corresponding first ring 187 located at the bottom of the outer conical surface of the lower cone is magnetized radially outwardly. In this context, "bottom" means the surface bounding the cavity 32. Preferably, also, plural rings on a cone are magnetized anti-parallel. Thus in FIG. 15, on the lower cone, the first ring 187 is magnetized outwardly, and the second ring 189 is magnetized inwardly, also in anti-parallel relationship with the corresponding second ring 191 on the upper cone.

As explained in greater detail in the Appendix, in FIGS. 4.1 and 4.2, the line $P_0$-B follows the outer cone surface, and the reference sphere is shown in the first quadrant with a radius of $\rho_i$. FIG. 4.4 shows the effect of the ring locations, with the parameter 0 representing a ring at the narrow end of the cone, in the lowermost position, and the parameter 1.0 representing a ring at the wider end of the cone, in the uppermost position furthest from the origin. Note that as the ring location moves further from the origin its effect lessens. FIG. 4.6 shows the reduced distortion of the redesign with the slightly increased value of K. FIG. 4.7 illustrates a partial or coarse compensation obtained using the two-ring example illustrated in FIG. 15. The inverted S-curves show the field effect of the two rings at θ=0°, and the two horizontal curves illustrate the field uniformity by field mapping over the sphere in the first quadrant for this simple illustrative example for the rings. The lower curve shows the distortion without the rings present, and the upper curve shows the effect of the rings. It will be noted that there is a rough compensating effect when the two curves are combined. To improve the uniformity, it will be necessary for this simple example to add more rings to achieve the high value of uniformity desired for optimum MRI imaging.

As with the other embodiments, it will be appreciated that the embodiments of FIGS. 11 and 14 represent only one quadrant of the structure. The full structure is obtained as illustrated in FIGS. 7–9 by rotating that quadrant about the vertical and horizontal axes originating at the origin 0, and thus expanded to include both upper right (shown in FIG. 11) and left quadrants, to form a circular-symmetrical magnetic structure 42, spaced opposite to an identical structure 44 corresponding to the lower right and left quadrants.

While the invention has been described in connection with preferred embodiments, it will be understood that modifications thereof within the principles outlined above will be evident to those skilled in the art and thus the invention is not limited to the preferred embodiments but is intended to encompass such modifications.

APPENDIX

Development of a 0.5 Tesla Permanent Conical Magnet

BY
MANLIO G. ABELE

June, 2003
New York, N.Y.
© Copyright Manlio G. Abele 2003

Contents

| | |
|---|---|
| 1. Introduction | 3 |
| 2. Conical Magnet | 3 |
| 3. Design Considerations | 19 |
| 4. Compensation of Field Distortion | 23 |
| 5. References | 34 |

1. INTRODUCTION

The generation of highly uniform magnetic fields is the primary goal of the design of magnets for NMR imaging in medical applications. The magnet described in this paper is a novel structure of permanently magnetized material that extends the field range to 0.5 Tesla, well above the current limit of commercially available permanent magnets, with a design approach that is consistent with size and weight well within practical limits.

The magnet combines a conical structure of permanently magnetized material with ferromagnetic pole pieces. The geometry of the magnet is computed in Section 2, that presents the principle of operation and the basic characteristics. The effect of the field perturbation due to the open magnet configuration is discussed in Section 3.

2. CONICAL MAGNET

Figure 2:
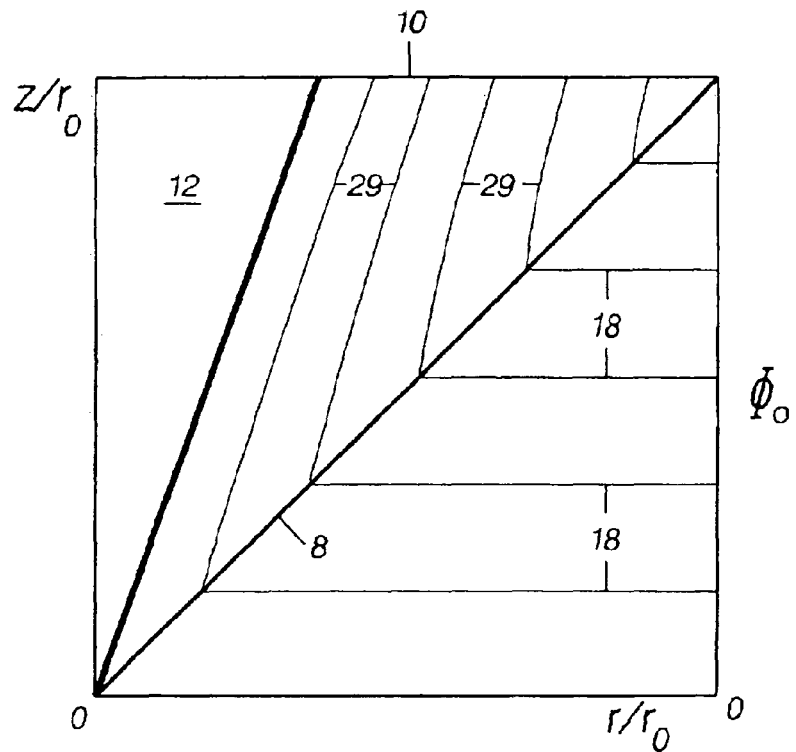
FIG. 2 illustrates some exemplary equipotential surfaces present in the structure of FIG. 1.

Fig. 2.1 shows the basic conical structure of magnetized material contained between two coaxial cones of half angles $\theta_1, \theta_0$. The material is assumed to be magnetized with a uniform remanence $J_0$ parallel to the axis $z$ of the cones. The medium surrounding the external cone is assumed to be non-magnetic, and the medium inside the internal cone is assumed to be a ferromagnetic material with infinite magnetic permeability.

Assume a system of spherical coordinates $r, \theta, \phi$ where $r$ is the distance of a point from the center $O$ of the cones, $\theta$ is the angle between $r$ and the axis $z$ of the cones, and $\phi$ is the angle between the plane formed by a point $P$ and the $z$ axis and an arbitrary plane that contains the $z$ axis.

The structure of Fig. 2.1 has been analyzed in detail by the author in a Technical Report [1]. Assume the limit of infinite radial dimension of the cones and consider the special case of a field configuration independent of the angular coordinate $\phi$. Let $$x = \cos \theta \qquad (2.1)$$

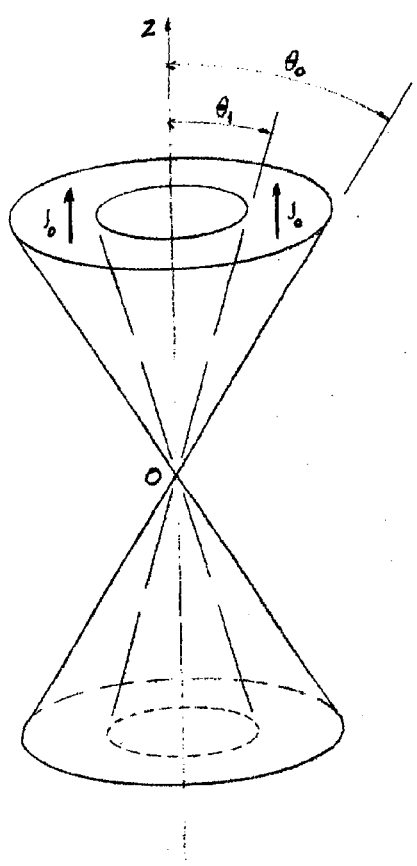
Fig. 2.1 Conical Structure.

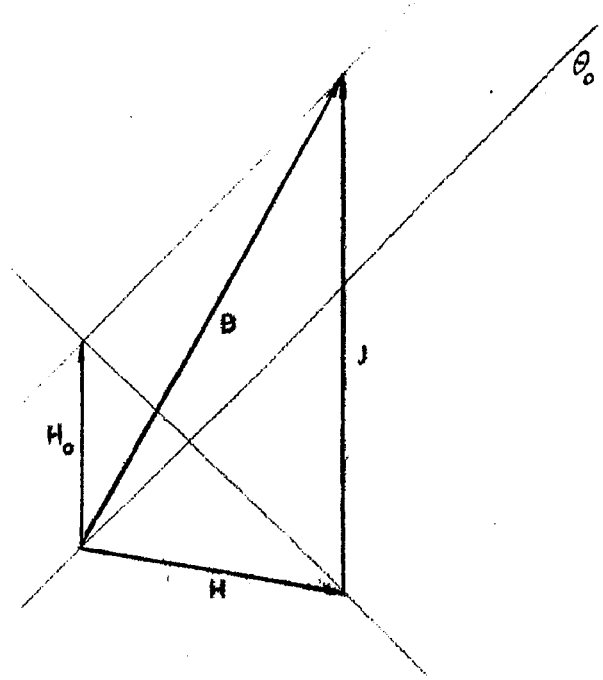
Fig. 2.2 Magnetic induction and intensity at the surface $\theta = \theta_0$.

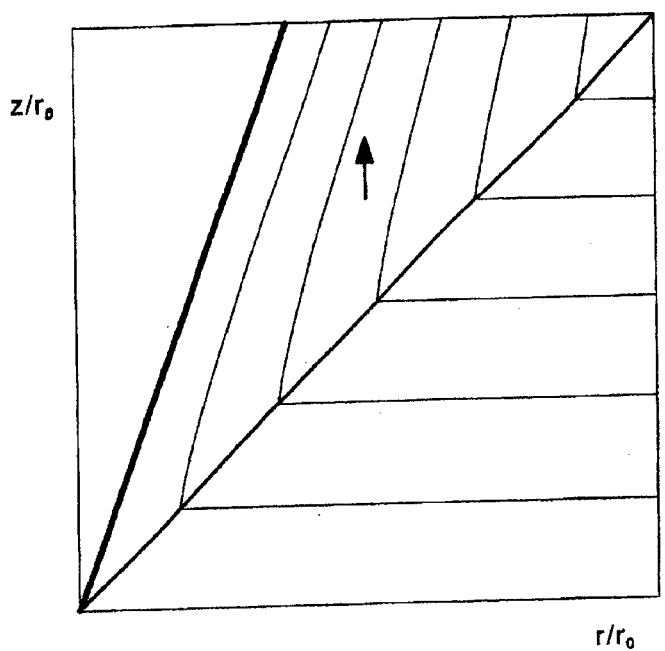
Fig 2.3 Equipotential lines.

The magnetostatic potential $\phi(\rho, \theta)$ generated by remanence $J_0$ within the magnetized material is given by the particular solution of the Laplace's equation that satisfies the boundary condition $$\phi(\rho, \theta) = 0 \qquad (2.2)$$

One has $$\varphi(\rho,\theta) = -\frac{J_0}{\mu_0}\left(1 - X_0^2\right) X_0 \rho \left[1 - \frac{X}{X_1} + \frac{X}{2} \ell n \left|\frac{(1+X_1)(1-X)}{(1-X_1)(1+X)}\right|\right] \qquad (2.3)$$

for $\theta_1 < \theta < \theta_0$ and $\delta - \theta_0 < \theta < \delta - \theta_1$. $\mu_0$ is the magnetic permeability of a vacuum and $$X_0 = \cos \theta_0, \quad X_1 = \cos \theta_1 \qquad (2.4)$$

In the region $\theta_0 < \theta < \delta - \theta_0$ the magnetostatic potential is $$\phi(\rho,\theta) = -\frac{J_0}{\mu_0}\left(1 - x_0^2\right) x \rho \left[1 - \frac{x_0}{x_1} + \frac{x_0}{x_2} \ell n \frac{(1+x)(1+x_0)}{(1-x_1)(1-x_0)}\right] \qquad (2.5)$$

Eq. (2.5) is the potential of a uniform magnetic field of intensity $H_0$ oriented parallel to the z axis and of magnitude $$\mu_0 H_0 = K J_0 \qquad (2.6)$$

where $$K = \left(1 - x_0^2\right)\left[1 - \frac{x_0}{x_1} + \frac{x_0}{2} \ell n \frac{(1+x_1)(1-x_0)}{(1-x_1)(1+x_0)}\right] \qquad (2.7)$$

The equipotential surfaces are planes perpendicular to z in the region $\theta_0 < \theta < \delta - \theta_0$ and within the magnetized material the equipotential surfaces are given by the equation $$\rho = \frac{C}{\frac{x}{2} \ell n \frac{(1+x_1)(1-x)}{(1-x_1)(1+x)} + 1 - \frac{x}{x_1}} \qquad (2.8)$$

where $$C = \frac{\mu_0 \phi}{J_0 x_0 (1 - x_0^2)} \qquad (2.9)$$

The field inside the cone is not uniform and the values of H and B at the surface of the cone è = è$_c$ are given by the vector diagram of Fig. 2.2

An example of the equipotential lines given by Eq. (2.8) is shown in Fig. 2.3 for the cone angles è$_1$ = 20°, è$_0$ = 45°. In this example, the uniform field in the region è$_0$ < è < δ - è$_0$ corresponds to a value of K as given by Eq. (2.7)

$$K = 0.426 \qquad (2.10)$$

Hence if one assumes a value $$J_0 \sim 1.3 \text{ Tesla} \qquad (2.11)$$

the cone generates a uniform field of intensity H$_0$ $$ì_0 H_0 \sim .55 \text{ Tesla} \qquad (2.12)$$

The basic schematic of Fig.2.1 can provide the computation of the field in a structure where the magnetized material is eliminated in the region $$-z_0 < z < +z_0 \qquad (2.13)$$

The new structure is shown in Fig. 2.4 where the two areas of the surfaces that limit region (2.13) are circles of radius $$r_0 = z_0 \tan è_0 \qquad (2.14)$$

The two circular areas are assumed to be surfaces of an infinite magnetic permeability material. Furthermore, the equipotential surface within the magnetized material that start from the circle of radius $r_0$ is also assumed to be transformed into a surface of infinite magnetic permeability material. As a consequence, the field configuration inside the magnetized material is still given by Eq. (2.3) and the structure of Fig. 2.4 generates the uniform field defined by Eqs. (2.6),(2.7) everywhere outside the magnetized material, including the gap between the

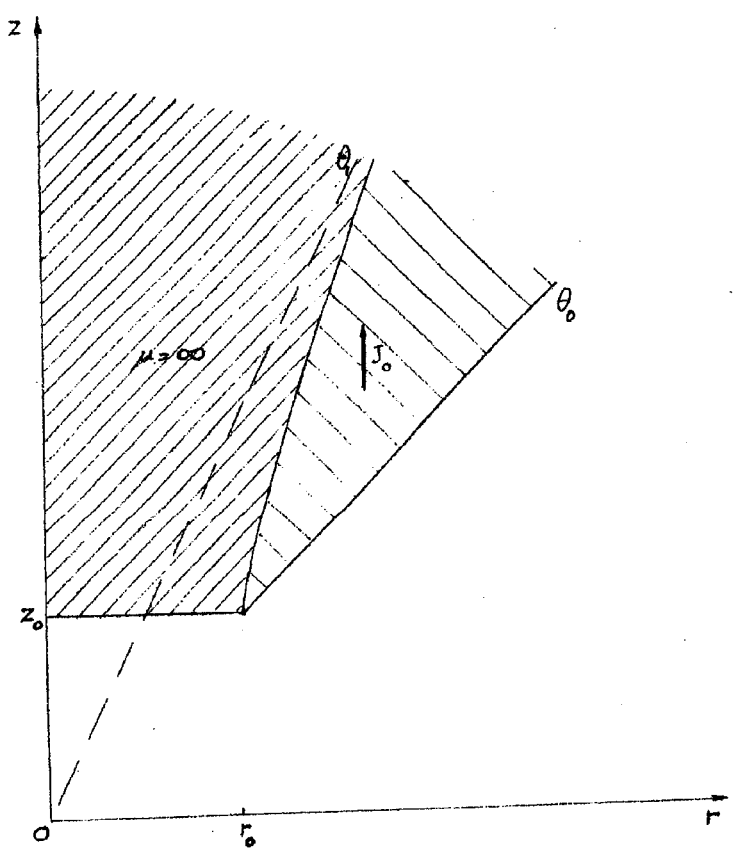
Fig. 2.4 Generation of the central gap.

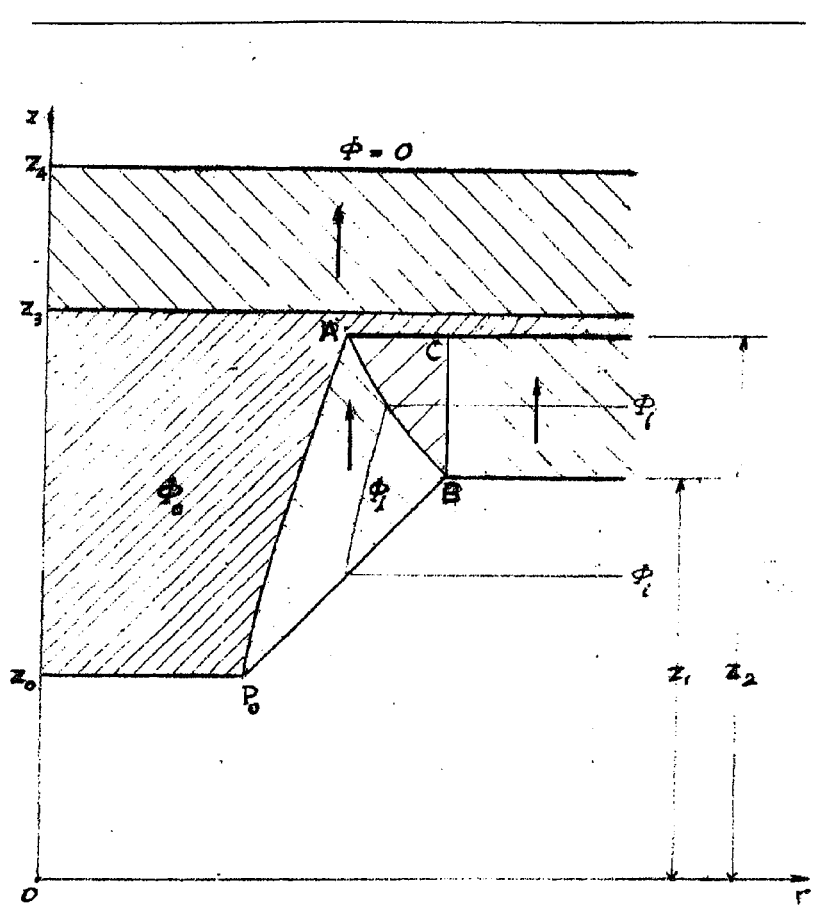
Fig. 2.5 Basic schematic of the magnet.

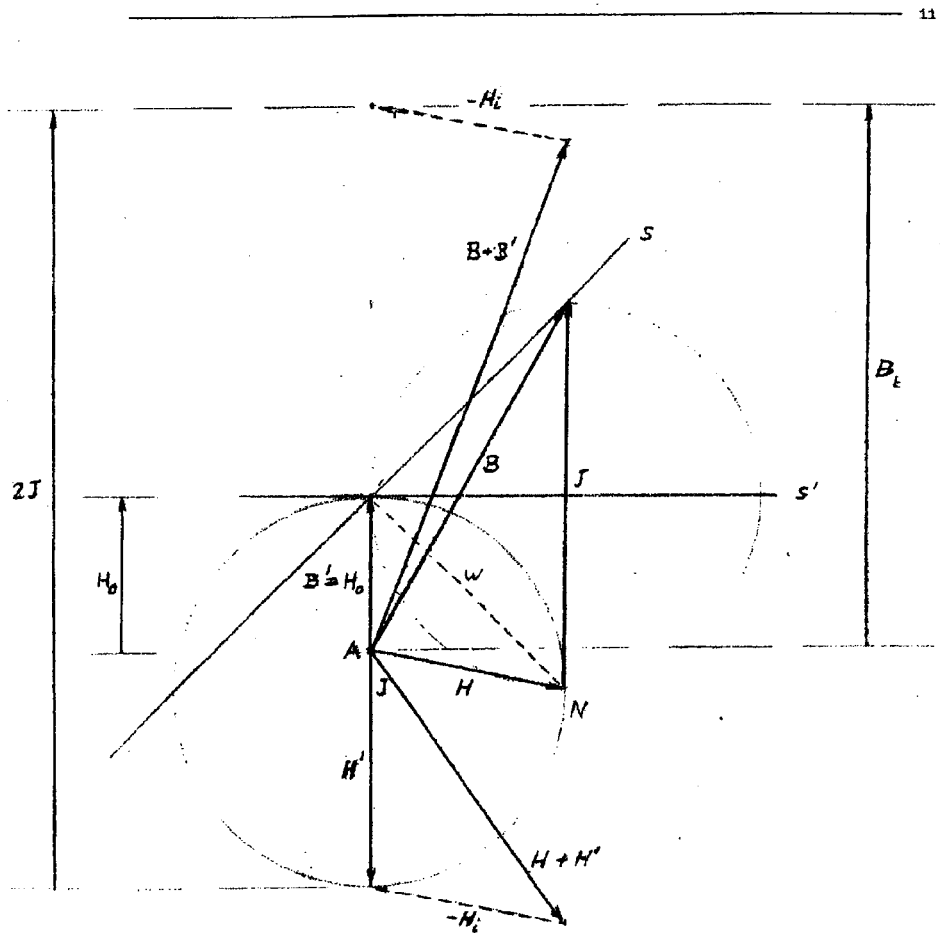
2.6 Computation of the remanence of the transition region (ABC).

ferromagnetic plates of radius $r_0$. An additional source, other than the magnetized material in Fig. 2.4, is necessary to maintain the block of ferromagnetic material in the structure of Fig 2.4 at the potential $$\ddot{O}_0 = -H_0 z_0 \qquad (2.15)$$

The design of the complete structure depends upon the external termination of the conical body of magnetized material. This can be accomplished by the transition from the conical structure to a cylindrical structure shown in the schematic of Fig. 2.5. The cylindrical structure is contained between the planes $z = z_1$, $z = z_2$ and its thickness $z_2 - z_1$ is given by $$K = \frac{Z_2 - Z_1}{Z_2} \qquad (2.16)$$

The cylindrical structure is magnetized with the uniform remanence $J_0$ parallel to the axis z. The structure cannot interface directly with the cone and a region (ABC) of magnetic material of remanence different from J has to be inserted between the cone and the cylindrical structure, as shown in Fig. 2.5. The computation of the geometry of region (ABC), and its magnetization is complicated by the cylindrical configuration of the magnet. However, even in the approximation of a two-dimensional geometry independent of the coordinate perpendicular to the plane of the section of Fig. 2.5, the transition between the two median would require a uniform remanence oriented along the z axis of magnitude [2]

$$J = 2 J_0 \qquad (2.17)$$

as shown in the vector diagram of Fig. 2.6, where H, B indicate the intensity and the induction in the cone, and H', B' indicate the intensity and the induction in the cylindrical structure. Because the intensity in the transition region coincides with the intensity in the cylindrical region the interface (AB) between the cone and region (ABC) is a line w of the points P of intersection of the equipotential lines Ö in the cone with the same equipotential lines within (ABC).

By virtue of Eqs (2.8) and (2.9), the equation of the equipotential lines inside the cone can be written in the form $$\frac{\rho}{\bar{\rho}} = \frac{\frac{x_0}{2}\ln\frac{(1+x_1)(1-x_0)}{(1-x_1)(1+x_0)} + 1 - \frac{x_0}{x_1}}{\frac{x}{2}\ln\frac{(1+x_1)(1-x)}{(1-x_1)(1+x)} + 1 - \frac{x}{x_1}} \quad (2.18)$$

where ñ is the distance of the point of potential Ö on the cone of angular width è$_0$ from O. In the coordinates ñ, è, the equations of the equipotential lines in the region (ABC) are $$\rho = \frac{z}{x}, \frac{z_2 - z}{z_2 - z_1} = \frac{\varphi}{\varphi_1} \quad (2.19)$$

Thus, the system of Eqs. (2.18) and (2.19) provides the equation of line w $$\frac{1}{x} = \frac{\bar{\rho}}{z} \frac{\frac{x_0}{2}\ln\frac{(1+x_1)(1-x_0)}{(1-x_1)(1+x_0)} + 1 - \frac{x_0}{x_1}}{\frac{x}{2}\ln\frac{(1+x_1)(1-x)}{(1-x_1)(1+x)} + 1 - \frac{x}{x_1}} \quad (2.20)$$

The potential Ö of the ì = ∞ component of the magnetic structure of Fig. 2.5 is generated with the additional planar structure contained between the planes z = z$_3$, z = z$_4$ where z$_3$ can be chosen somewhat arbitrarily, and the thickness z$_4$ - z$_3$ is given by $$\frac{z_4 - z_3}{z_0 + z_4 - z_3} = K \quad (2.21)$$

Again, this external planar structure is uniformly magnetized with the remanence J$_0$ parallel to the z axis. The surface z = z$_4$ is the interface between the magnetic structure and the external yoke of the magnet that closes the flux of the magnetic induction.

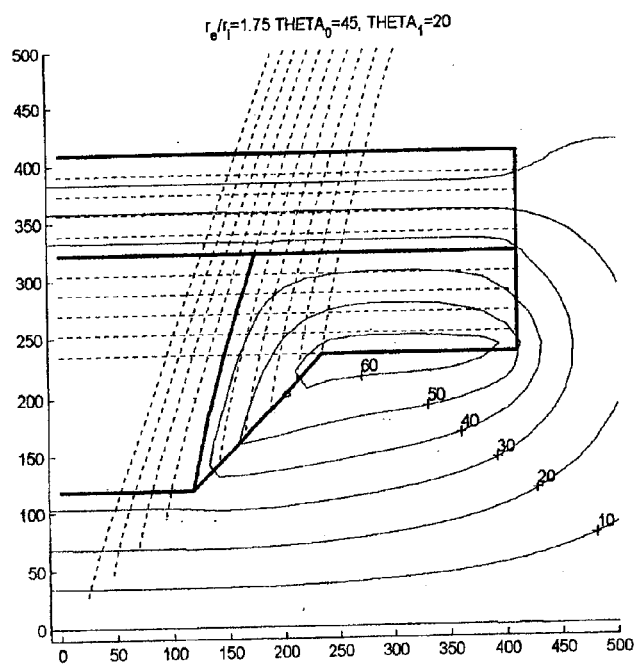
Fig. 3.1 Equipotential lines with no transition structure between cone and cylinder.

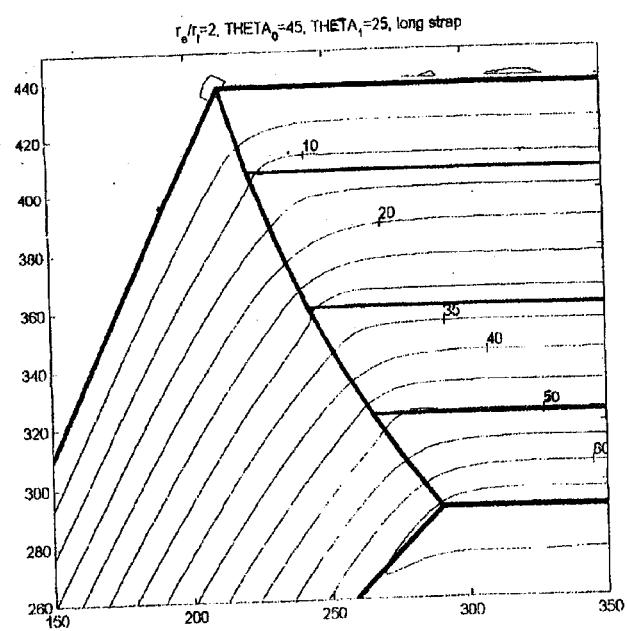
Fig. 3.2 Equipotential lines in the transition region with the insertion of the three straps.

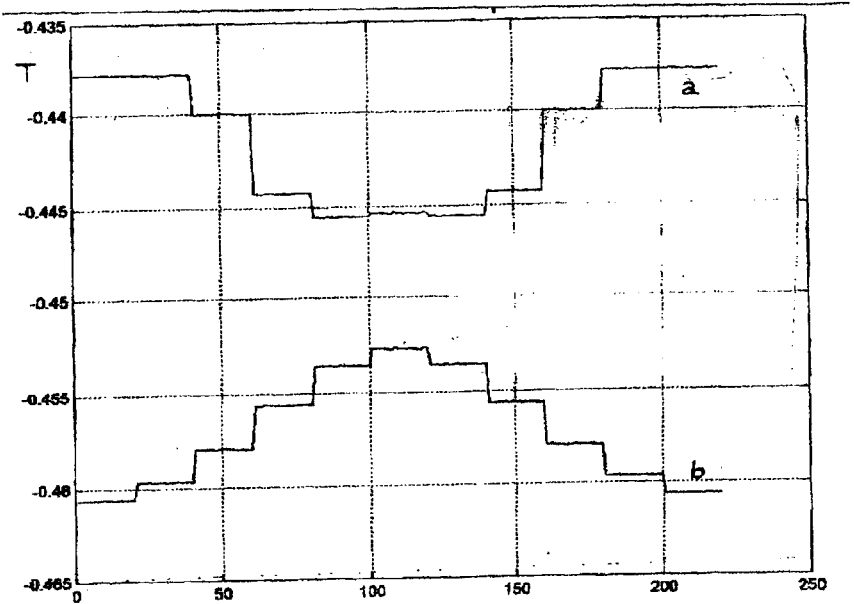
Fig. 3.3 Field on a reference sphere with center at O and diameter $2z_{a}$, (a) conical magnet. (b) conventional magnet.

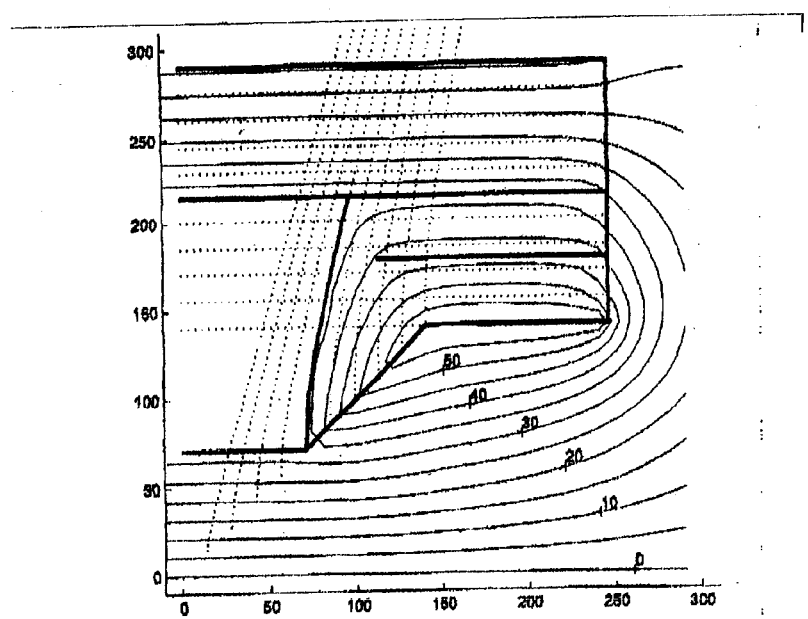
Fig. 3.4 Equipotential lines with a single strap and $K' = 1.03 \, K$.

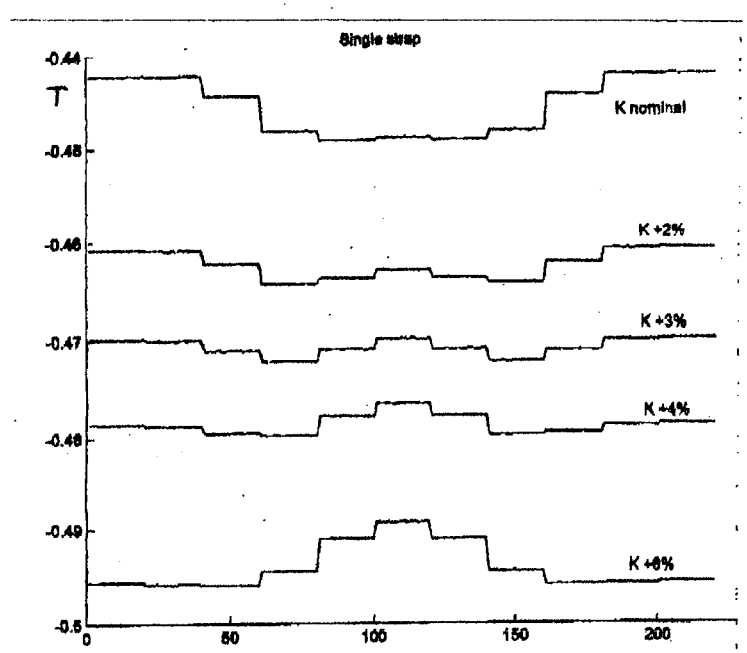
Fig. 3.5 Field over the reference sphere for increasing valuve of K'.

3. DESIGN CONSIDERATIONS

The exact solution presented in Section 2 is affected by two main constraints in its implementation in a practical design. In the first place, a finite external radius has to be chosen and its value has to be large enough to minimize the perturbation of the field uniformity in the gap between the pole pieces. Second, the design presented in this paper is aimed at the development of a magnetic structure capable of generating the largest possible field compatible with practical considerations. This means that the highest commercially available remanence J would be chosen for the magnetic material. If a value $J_o \sim 1.3$ T is chosen, as assumed in Section 2, no permanent magnet of remanence $2 J_o$ is available for the implementation of the exact designs of the transition between the cone and the cylindrical sections. A remanence $2 J_o$ is well above the theoretical limit of what can be achieved in the development of rare earth magnetic materials. As a consequence an approximate solution may be adopted taking advantage of the fact that the transition region is well outside the region of interest is the gap between the pole pieces. The approximate solution adopted in this design eliminates the transition region (ABC) and assume a uniform distribution of $J_o$ throughout the region of the cone and the cylindrical region as shown in Fig. 3.1. The effect of the field distortion is illustrated in the example of Fig. 3.1 which shows the result of the numerical calculation of the equipotential lines. A partial correction of the field distortion in Fig. 3.1 is possible with the insertion of magnetized straps within the transition region. The straps are relatively thin plates of high magnetic permeability material deployed along the theoretical equipotential surfaces within the transition region. Schematically, the insertion of the straps is shown in Fig 3.2 where the straps are extended over the entire radial dimension of the cylindrical structure.

Ideally, the region of interest should extend to the full region of the gap between the pole pieces. Consider the value of the field intensity over a sphere whose center coincides with the center of the gap and whose diameter is equal to the dimension $2z_o$ of the gap. An example of the numerical calculation of the field intensity over circles on the sphere in planes perpendicular to the axis $z$ is shown in Fig. 3.3. One observes that the field at the points $z = \pm z_o$ is lower than the field on the equational plane $z = 0$.

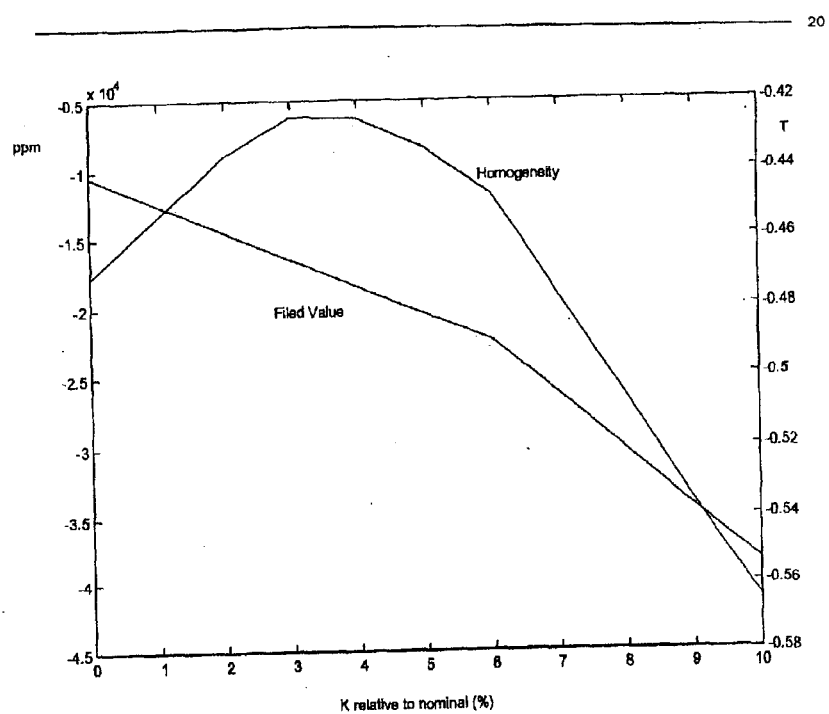
Fig. 3.6 Field homogeneity and field intensity versus K'

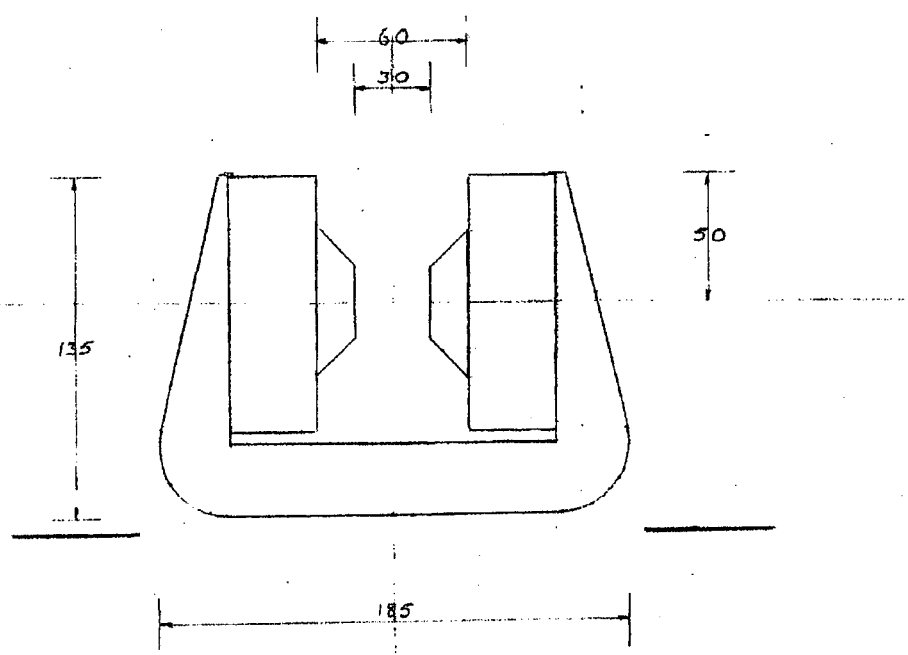
Fig. 3.7 View of the magnet with the external yoke.

This is contrary to what is normally found between the pole pieces of a conventional magnet, where the filed increases from the center along the axis and decreases with the radial distance in the plane perpendicular to the axis as shown in Fig.3.3. Thus, in the implementation of the conical magnet, the field generated by the cylindrical region over compensates the field generated within the central gap. As a consequence, the external planar structure contained between the planes $z_3 < z < z_4$ can be designed for a value $K' > K$ and the value of $K'$ can be chosen to minimize the variation of the field intensity in the region of interest.

The results of the selection of $K'$ are shown in the magnet configuration of Fig 3.4 where a single strap is used for the partical correction of the field distortion in the transition between cone and cylindrical structure. The equipotential lines in Fig 3.4 correspond to $$K' = 1.03\ K \qquad (3.1)$$

The plotting of the intensity over the reference sphere of diameter approximately equal to $2z_0$ is presented in Fig. 3.5 which shows that for $K'$ larger than the value (3.1) the field intensity on the equatorial plane becomes larger than the intensity on the z axis. At the optimum condition the field homogeneity on the reference sphere is better than ~ 1 %. The homogeneity changes rapidly with different values of $K'$ as shown in Fig. 3.6. As expected, the field intensity within the sphere increases as $K'$ increases. As shown in Fig. 3.5 the field at the center of the sphere is $$\mathbf{1}_0\ H_0 \sim .0.47\ \text{Tesla} \qquad (3.2)$$

for $J_0 \sim 1.38$ Tesla. The homogeneity at condition (3.1) is a remarkably small value as a design parameter of the open magnet presented in this paper, and one can expect the tolerances of fabrication and material properties to have a larger affect on a practical implementation of the design approach. Hence, a conventional shimming technique can be used to improve the homogeneity to a value of the order of 50 ppm or better consistent with imaging requirement.

The schematic of Fig. 3.4 corresponds to the basic parameters $$K = 0.51, \quad \grave{e}_0 = 45°, \quad \grave{e}_1 = 16°$$

$$r_e = 1.75\, r_1 \tag{3.3}$$

4. COMPENSATION OF FIELD DISTORTION

Assume that the region of interest is the sphere of diameter $2z_0$ and center located at the center O of the magnet, where the field uniformity must satisfy the imaging requirements. A distortion of the uniform field is caused by the finite dimensions of a practical magnet and by the fabrication tolerances of the geometry and distribution of the magnetization. As shown in Section 3, a partial computation of the effect of finite dimensions can be achieved in the design phase by modifying the value of K of the external magnetic structure. The distortion due to the tolerances cannot be compensated in the design phase and requires the use of a shimming technique based on the measurement of the field generated by the assembled magnet. The shimming technique requires the insertion of a magnetic structure whose configuration is dictated by a logic based on the field measurements.

Assume that the shimming is performed by means of a distribution of magnetic dipoles on the conical surface ($P_0$ B) of the schematic of Fig. 2.5 as shown in Fig. 4.1. The dipole distribution is defined at each point P by a dipole moment density m per unit surface of components $m_r$, $m_z$ as indicated in Fig. 4.1. Assume that $m_r$, $m_z$ are independent of the angular coordinate $\psi$. The dipole distribution $m_z$ on the element of surface $2\pi r d\rho$ of a ring of radius r coaxial with the axis z generates a field on the sphere of radius $\rho_0$ shown in Fig. 4.2, whose potential is shown in Fig 4.3 for six equally spaced positions on the element of surface line ($P_0$B) The z component of the intensity corresponding to the six curves of Fig. 4.3 is shown in Fig. 4.4. The effect of the orientation of the dipole moment density is illustrated in Fig. 4.5 where the z component of the intensity is computed for the component $m_r$ of the dipole moment density. The fields generated by $m_r$ and $m_z$ exhibit a similar behavior. In both cases the field on the reference sphere decreases rapidly with the distance from point $P_0$. The significant difference between the two cases is the larger intensity generated by $m_r$ located in proximity of $P_0$ where $m_r$ is essentially perpendicular to the surface of the ferromagnetic pole piece.

Assume that the chosen dipole distribution is limited to the component $m_r$. The z component of the intensity on the reference sphere of radius $\rho_0$ can be written in the form $$\mu_0 H_z(\theta) = \int_{P_0}^{P_1} \Psi(\rho,\theta) m_r(\rho) d\rho \qquad (4.1)$$

Where $\Psi(\rho,\theta)$ is a function of the geometry of the magnetic structure and the distance between a point of the reference sphere of coordinates $\theta$ $\psi$ and a point of the conical surface $\theta = \theta_*$ with the same angular coordinate $\psi$. The complexity of the geometry of the magnetic structure makes it impossible to achieve an exact analytical solution of Eq. (4.1) and numerical calculations have to be used to map function $\psi$ as a function of $\theta$ for each value of $\rho$. The maximum range of interval $P_0 P_1$ in Eq. (4.1) extends to the length $P_0 B$ of Fig 2.5. With the assumption that the dipole distribution in confined to n+1 rings equally spaced alone the radial coordinate $\rho$ at a distance $$\delta\rho = \frac{\rho_n - \rho_0}{n} \qquad (4.2)$$

Eq. 4.1 transforms to $$\mu_0 H_z(\theta) = \sum_{h=0}^{n} \Psi(\rho_h, \theta) p(\rho_h) \qquad (4.3)$$

where $$p(\rho_h) = m_r(\rho_h) \delta\rho \qquad (4.4)$$

$\rho_0, \rho_n$ are the radial coordinates of points $P_o$, B respectively. The field on the reference sphere can be expanded in spherical harmonicics $$\mu_0 H_z(\theta) = \sum_{k=0}^{\infty} b_k P_k(\cos\theta) \qquad (4.5)$$

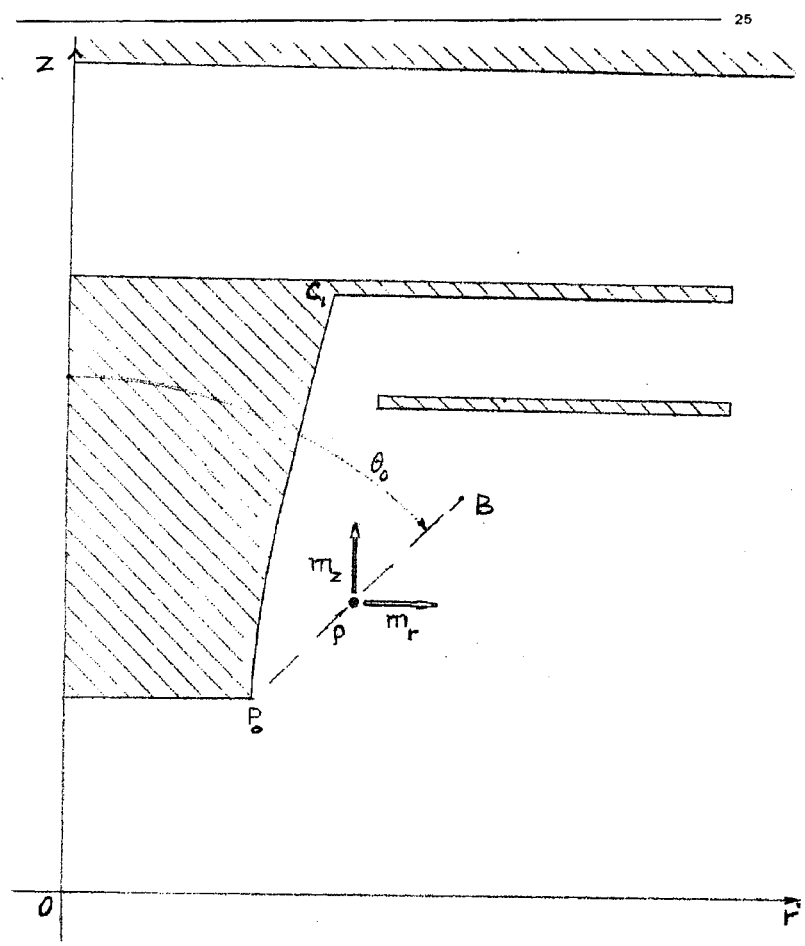
Fig. 4.1 Compensating dipole

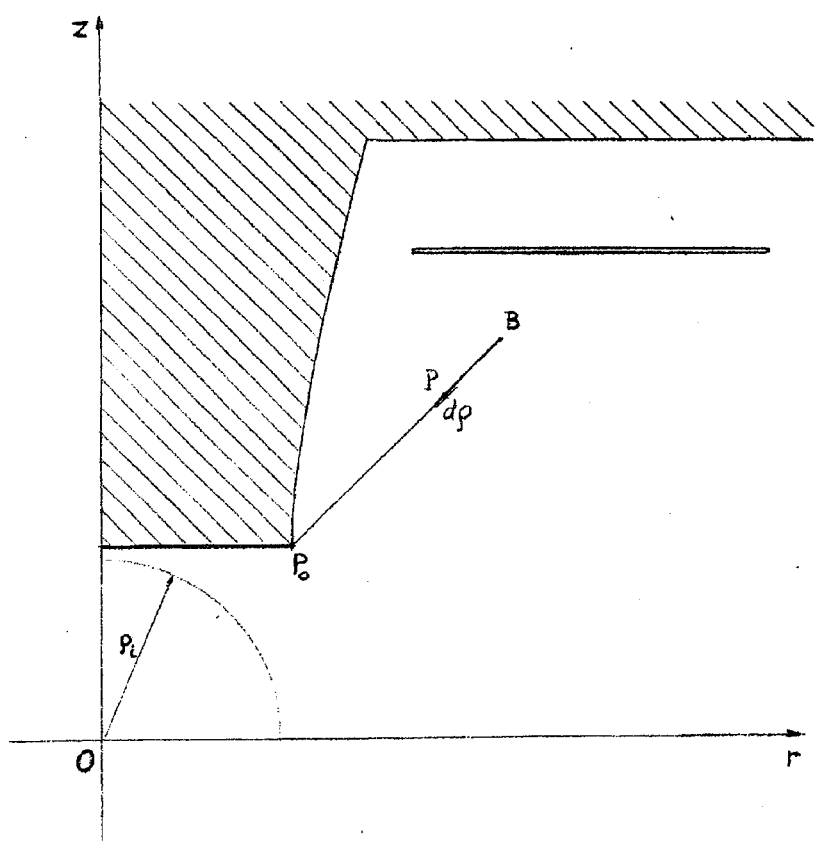
4.2 Schematic for the computation of the dipole field

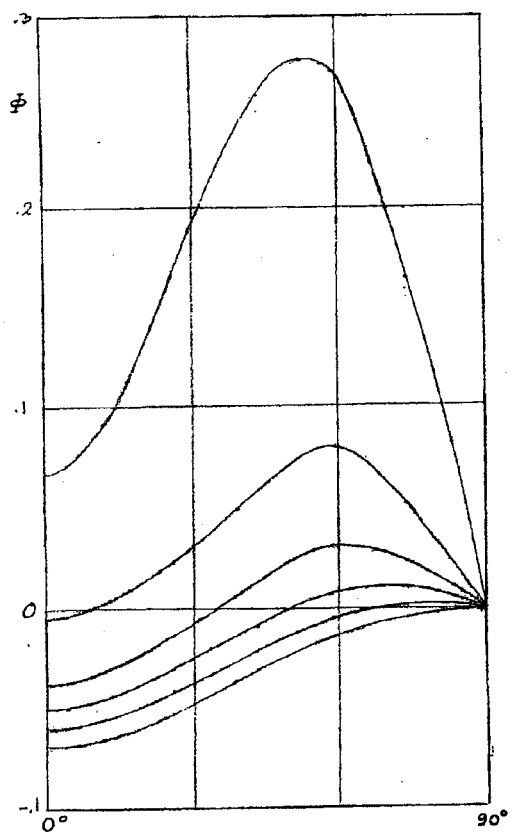
Fig. 4.3 Potential on the reference sphere generated by a distrubution of dipoles oriented along the axis z.

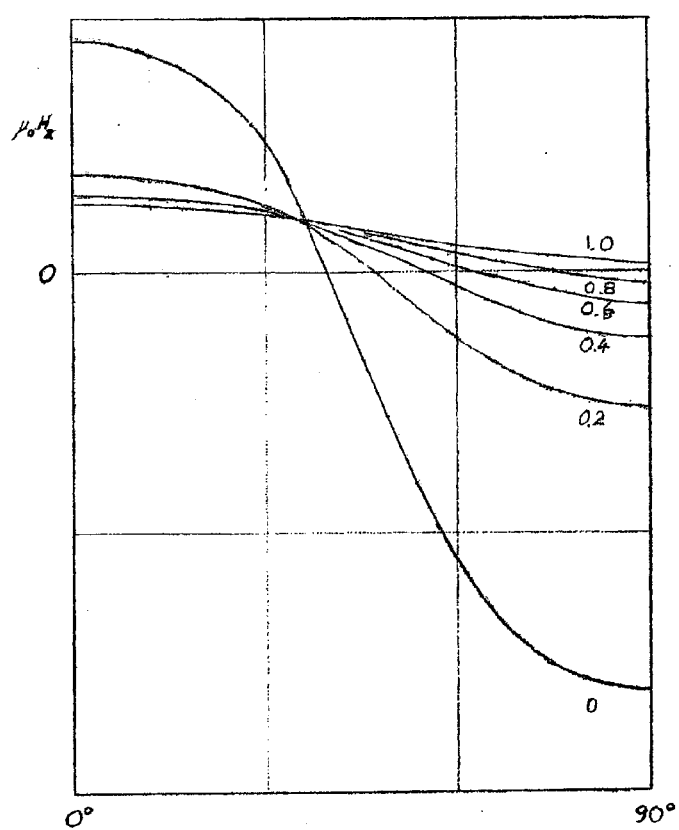
Fig. 4.4 z component of the field generated by the z component of the dipole distribution

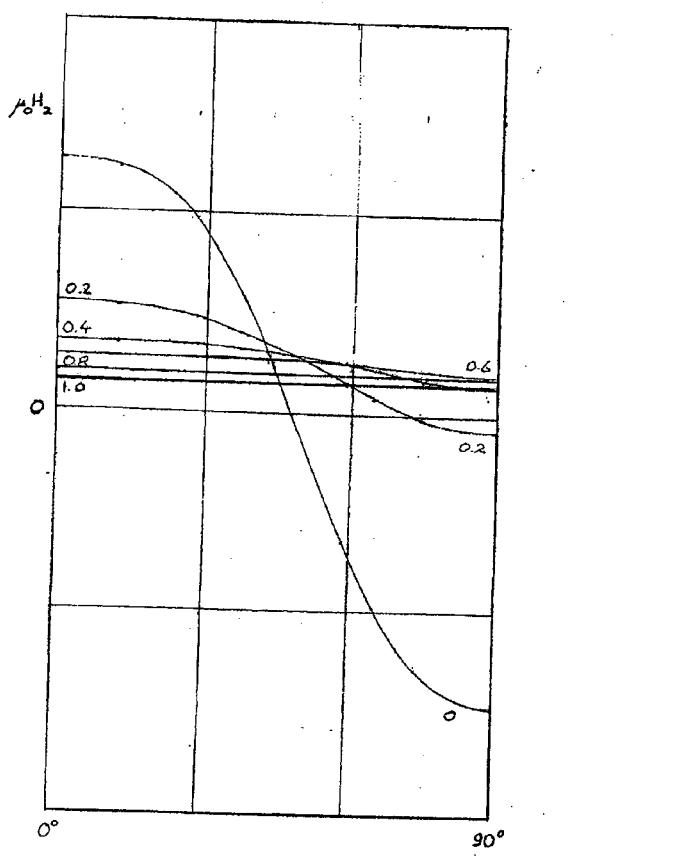
Fig. 4.5 z component of the field generated by the r component of the dipole distrubution Where $P_k$ is the Legendre's polynomial of the first kind defined as $$\left\{ P^k(x) = \frac{1}{2^k k!} \frac{d^k}{dx^k}(x^2-1)^k \right. \\ x = \cos\theta \tag{4.6}$$

If the field satisfies the symmetry condition $$H_z(\pi - \theta) = H_z(\theta) \tag{4.7}$$

the expansion (4.5) is limited to the even values of $k$. The coefficients $b_k$ of the expansion are given by $$b_k = \frac{2k+1}{2} \sum_{h=0}^{n} C_{k,h} p(\rho_h) \tag{4.8}$$

where $$C_{k,h} = \int_{-1}^{+1} \Psi(\rho_h, x) P_k(x) dx \tag{4.9}$$

Identically, the distortion $\delta$ Hz of the field generated by the magnet on the reference sphere can be expanded in the spherical harmonicics $$\mu_0 \, \delta H_z(x) = \sum_{k=0}^{\infty} a_k P_k(x) \tag{4.10}$$

where the coeffecients $a_k$ are $$a_k = \frac{\mu_0}{2}(2_k + 1) \int_{-1}^{+1} [\delta h_z(x)] P_k(x) dx \tag{4.11}$$

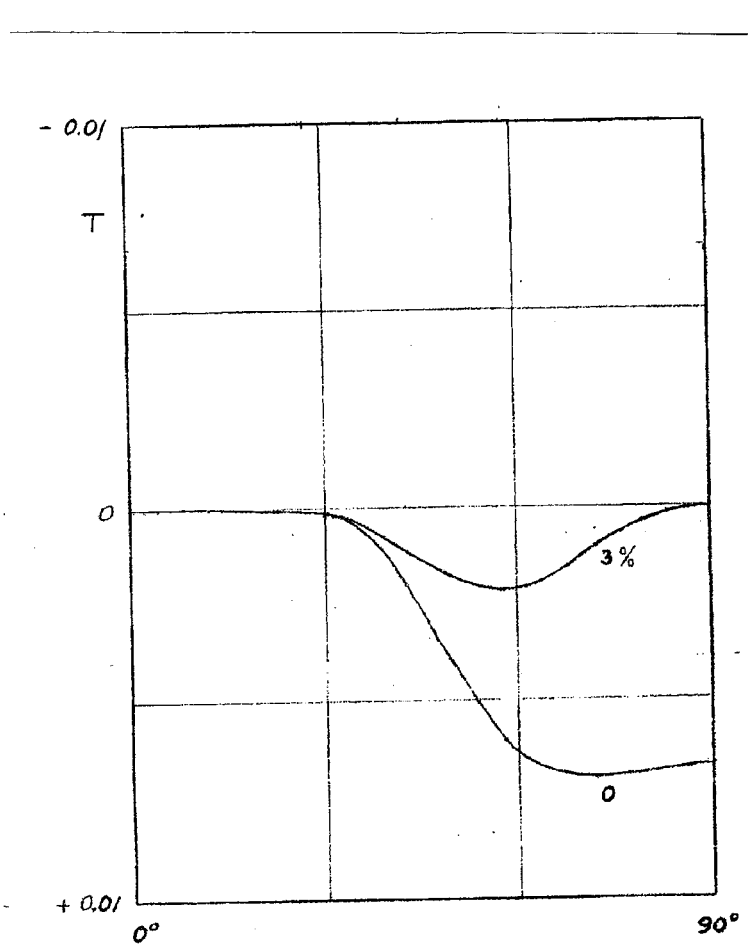
Fig. 4.6 Intensity on the reference sphere for K' = K and K' = 1.03

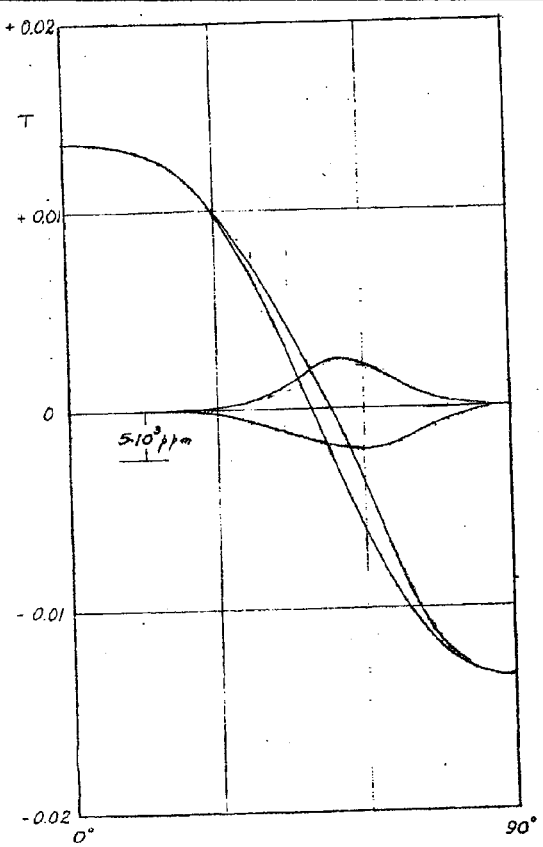
Fig. 4.7 Partial compensation of the field distortion with two dipole rings

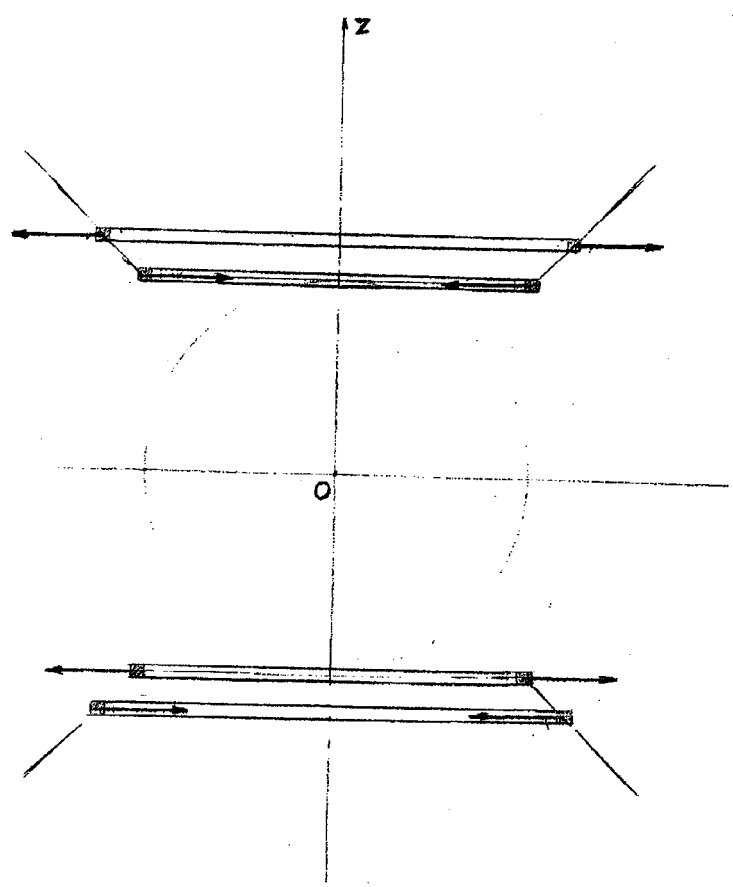
Fig. 4.8 Schematic of a two ring dipole structure and the field distortion is eliminated if coeffiecients $b_k$ satisfy the system of equations $$b_k = a_k$$
$$(k = 0,1,2,...) \quad (4.12)$$

i.e. the distribution of dipoles on the conical surface $\theta = \theta_0$ that cancels the field distortion is given by the solution of the system of equations $$\sum_{h=0}^{n} C_{k,h} \; p(\rho_h) = -\mu_0 \int_{-1}^{+1} [\delta H_z(x)] \; P_k(x) dx \quad (4.13)$$

$$(k = 0,1,2,...)$$

In a practical situation the compensation of the field distortion can be confined to a limited number of the lowest order harmonies, which as a consequence results in the same limited number of rings of the compensation structure of dipoles.

The compensation with the dipole distribution on the conical surface $\theta = \theta_0$ can be illustrated in the simple example of the magnetic structure introduced in Section 3 and depicted in Fig. 3.4. Consider the case of the dual distribution of magnetic material where the value of K' of the external layer in the region in larger than the value in the rest of the magnetic structure. Fig. 4.6 show the plotting of the intensity over the reference sphere for K' = K and for the optimum value (3.1) of K' which minimizes the field distortion within the sphere. A common zero level of the field in Fig 4.6 is arbitrarily chosen for the two values of K'. In the particular case of K' = 1.03K the zero level corresponds to an average value of approximately 0.47 Tesla at the center of the sphere. As shown in Fig 4.6 the field attains the same value of 0.47 Tesla at both ends of the angular integral $\theta = 0$ and $\theta = 90°$. In the structure selected for the computation of Fig. 4.5, assume that the dipole distribution is limited to the first two rings, $\rho = \rho_0$, $\rho = \rho_1$ i.e.

$$p(\rho_h) = 0$$
$$h > 1 \quad (4.14)$$

i.e.

Select the values of $p(\rho_0)$ and $p(\rho_i)$ that satisfy the equation $$-p(\rho_0)\left[\Psi(\rho_0,0)-\Psi\left(\rho_0,\frac{\pi}{2}\right)\right]=p(\rho_1)\left[\Psi(\rho_1,0)-\Psi\left(\rho,\frac{\pi}{2}\right)\right] \quad (4.15)$$

The total field generated at $=0$ by the two rings is $$\mu_0\delta_1 H_z(0) = p(\rho_1)\Psi(\rho_1,0) + p(\rho_0)\Psi(\rho_0,0) \quad (4.16)$$

Thus the combination of the fields generated by the two rings over the reference sphere is the sum of a term independent of $\theta$ given by Eq. (4.16) and a second term $\delta_2 H_z(\theta)$ that is zero at $\theta = 0$ and $\theta = 90°$ and has a maximum as shown in Fig. 4.7.

The same figure shows the field generated by the two rings $$p(\rho_0)\Psi(\rho,\theta), p(\rho_1)\Psi(\rho_1,\theta) - \theta\mu_0\delta_1 H_z(0) \quad (4.17)$$

In the first approximation the correction of the distortion is accomplished by selecting the value of the dipole moment distribution that makes the maximum of $\mu_0\delta_2 H_z$ equal to the maximum of value $\mu_0\delta_2 H_z$ computed in Fig 4.5 for $K^1 = 1.03$ K. As apparent from Fig. 4.5 the residual distortion is of the order of $10^3$ ppm.

The term generated by the rings does not contribute to the field distortion and its effect is a small change of the field of the magnet. A schematic of the rings configuration is presented in Fig. 4.8

5. REFERENCES

[1] Abele MG, Generation of Uniform Fields with Conical Permanent Magnets. TR 42, Department of Radiology, New York University. January 1, 1997

[2] Abele MG, Structures of Permanent Magnets, John Wiley and Sons, Inc., 1993

What is claimed is:

1. A magnetic structure for generating a uniform magnetic field capable of implementing NMR imaging of the head of a patient within a region of interest, comprising:
   a) first and second magnetic structures defining a first cavity having the region of interest and configured to accommodate the head of a patient and defining adjacent the first cavity a second cavity, larger than the first cavity, configured to accommodate the shoulders of the patient when the latter's head is positioned in the first cavity, the first and second magnetic structures being positioned on opposite sides of the first and second cavities and defining a common longitudinal axis through the centers of the first and second magnetic structures and providing access from the outside for surgical intervention to the head of the patient when positioned within the first cavity,
   b) each of the first and second magnetic structures comprising a magnetic structure including:
      i) an annular conical section of permanent magnetic material and having a narrower end and a wider end connected by inner and outer substantially conical surfaces and a conical axis coincident with the common longitudinal axis, the narrower end being positioned closer to the region of interest than the wider end, the conical section having a first value and a first orientation of remanence,
      ii) an inner essentially cylindrical magnetic section of permanent magnetic material and having a longitudinal axis coincident with the common longitudinal axis and adjacent and magnetically coupled to the wider end of the conical section, the inner cylindrical magnetic section extending radially in a direction away from the common longitudinal axis, the inner cylindrical magnetic section having a second value and a second orientation of remanence,
      iii) transition means for interfacing the wider end of the conical section and the adjacent end of the inner cylindrical magnetic section for at least partially correcting for field distortion in or near the region of interest arising from the magnetic coupling between the wider end of the conical section and the adjacent end of the inner cylindrical magnetic section.

2. A magnetic structure as claimed in claim 1, wherein each of the first and second magnetic structures further comprises a pole piece member of ferromagnetic material and positioned within the conical section adjacent its inner surface and having an axis also coincident with the common longitudinal axis.

3. A magnetic structure as claimed in claim 2, wherein the first orientation of remanence is substantially the same as the second orientation of remanence.

4. A magnetic structure as claimed in claim 3, wherein the transition means is constituted by an inner portion of the inner cylindrical magnetic section having a value of remanence that is greater than that of the conical section.

5. A magnetic structure as claimed in claim 4, wherein the value of remanence of the inner portion of the inner cylindrical magnetic section is about twice that of the conical section.

6. A magnetic structure as claimed in claim 2, wherein the first value and first orientation of remanence are substantially the same as the second value and the second orientation of remanence.

7. A magnetic structure as claimed in claim 6, wherein the transition means is constituted by at least one magnetic strap extending radially within the inner cylindrical section to force surfaces therein intended to be equipotential to become more equipotential.

8. A magnetic structure as claimed in claim 7, wherein the magnetic strap extends up to but spaced from the inner surface of the conical section.

9. A magnetic structure as claimed in claim 2, wherein the magnetic properties and configuration of the conical section and inner cylindrical section are based on an initial selected design factor K, the magnetic structure being actually configured on the basis of a design factor K selected to have a value slightly larger than the factor originally used in the design such that the field uniformity in the region of interest is improved.

10. A magnetic structure as claimed in claim 2, wherein each of the first and second magnetic structures further comprises an outer cylindrical permanent magnetic section having an axis coincident with the common longitudinal axis and extending over the inner cylindrical magnetic section and the ferromagnetic pole piece member.

11. A magnetic structure as claimed in claim 10, wherein the outer cylindrical magnetic section has a third value of remanence and a third orientation of remanence.

12. A magnetic structure as claimed in claim 11, wherein the third orientation of remanence is substantially the same as the first orientation of remanence and the second orientation of remanence.

13. A magnetic structure as claimed in claim 12, wherein the first, second and third orientations of remanence are parallel to the common longitudinal axis.

14. A magnetic structure as claimed in claim 13, wherein the third value of remanence is larger than the first and second values of remanence.

15. A magnetic structure as claimed in claim 10, wherein the ferromagnetic pole piece member is recessed, and the outer cylindrical magnetic section has an inwardly extending section that extends into the recess of the ferromagnetic pole piece member.

16. A magnetic structure as claimed in claim 10, wherein each of the first and second magnetic structures further comprises a magnetic strap extending radially between the inner cylindrical magnetic structure and a section of the outer cylindrical magnetic section spaced from the inwardly extending section.

17. A magnetic structure as claimed in claim 16, further comprising a soft ferromagnetic section interconnecting the magnetic strap and the ferromagnetic pole piece along the inner surface of the conical section.

18. A magnetic structure as claimed in claim 16, wherein each of the first and second magnetic structures further comprises a non-magnetic section between the section of the outer cylindrical magnetic section spaced from the inwardly extending section and the latter.

19. A magnetic structure as claimed in claim 18, wherein the non-magnetic insert has a trapezoidal cross-section.

20. A magnetic structure as claimed in claim 10, wherein the conical section, and the inner and outer cylindrical magnetic sections are configured to produce within the region of interest in the first cavity a uniform magnetic field capable of implementing NMR imaging and to extend the uniform field within the region of interest to the second cavity such that the uniformity of the magnetic field in the region of interest remains capable of implementing NMR imaging.

21. A magnetic structure as claimed in claim 10, wherein the first and second magnetic structures are configured such that the second cavity surrounds the first cavity and both the first and second magnetic structures are circular symmetric about the common longitudinal axis.

22. A magnetic structure as claimed in claim 10, further comprising a yoke magnetically connected to the first and second magnetic structures.

23. A magnetic structure as claimed in claim 10, wherein the ferromagnetic pole piece member of each of the first and second magnetic structures has a high permeability and a generally conical shape.

24. A method of designing a magnetic structure for generating a uniform magnetic field capable of implementing NMR imaging of the head of a patient within a region of interest, the magnetic structure comprising:
   a) first and second magnetic structures defining a first cavity having the region of interest and configured to accommodate the head of a patient and defining adjacent the first cavity a second cavity, larger than the first cavity, configured to accommodate the shoulders of the patient when the latter's head is positioned in the first cavity, the first and second magnetic structures being positioned on opposite sides of the first and second cavities and defining a common longitudinal axis through the centers of the first and second magnetic structures and providing access from the outside for surgical intervention to the head of the patient when positioned within the first cavity,
   b) each of the first and second magnetic structures comprising a magnetic structure including:
      i) an annular conical section of permanent magnetic material and having a narrower end and a wider end connected by inner and outer substantially conical surfaces and a conical axis coincident with the common longitudinal axis, the narrower end being positioned closer to the region of interest than the wider end, the conical section having a first value and a first orientation of remanence,
      ii) an inner essentially cylindrical magnetic section of permanent magnetic material and having a longitudinal axis coincident with the common longitudinal axis and adjacent and magnetically coupled to the wider end of the conical section, the inner cylindrical magnetic section extending radially in a direction away from the common longitudinal axis, the inner cylindrical magnetic structure having a second value and a second orientation of remanence,
      iii) transition means for interfacing the wider end of the conical section and the adjacent end of the inner cylindrical magnetic section for at least partially correcting for field distortion in or near the region of interest arising from the magnetic coupling between the wider end of the conical section and the adjacent end of the inner cylindrical magnetic section,
      iv) a pole piece member of ferromagnetic material and positioned within the conical section adjacent its inner surface and having an axis also coincident with the common longitudinal axis,
      v) an outer cylindrical permanent magnetic section having an axis coincident with the common longitudinal axis and extending over the inner cylindrical magnetic section and the ferromagnetic pole piece member;
   comprising the steps:
   A) initially selecting a design factor K for configuring the magnetic properties and configuration of magnetic components including the conical section, the inner and outer cylindrical magnetic sections, and the transition means,
   B) measuring the field uniformity in the region of interest for values of K that differ by no more than 10% from the initially selected design factor K,
   C) reconfiguring the magnetic components using that value of K taken from the measurements made during step B) that shows the greatest uniformity.

25. A method as claimed in claim 24, wherein the value of K chosen in step C) is larger than the initially selected design factor K by between 2 and 4%.

26. A method as claimed in claim 25, further comprising the additional steps of providing additional compensation by a shimming technique for reducing field distortions due to fabrication tolerences:
   D) constructing at least first rings of permanent magnetic material dimensioned to surround and contact the outer conical surfaces of both conical sections,
   E) magnetizing the first rings such that when positioned on the conical magnets, the orientation of their remanence is radial and perpendicular to the longitudinal axis,
   F) placing the first rings on the outer conical surface at its bottom vertex of both conical sections,
   G) if necessary, reconfiguring the first rings or adding second rings to the conical sections to further reduce field distortions.

27. A method of shimming a magnetic structure for generating a uniform magnetic field capable of implementing NMR imaging of the head of a patient within a region of interest, the magnetic structure comprising:
   a) first and second magnetic structures defining a first cavity having the region of interest and configured to accommodate the head of a patient and defining adjacent the first cavity a second cavity, larger than the first cavity, configured to accommodate the shoulders of the patient when the latter's head is positioned in the first cavity, the first and second magnetic structures being positioned on opposite sides of the first and second cavities and defining a common longitudinal axis through the centers of the first and second magnetic structures and providing access from the outside for surgical intervention to the head of the patient when positioned within the first cavity,
   b) each of the first and second magnetic structures comprising a magnetic structure including:
      i) an annular conical section of permanent magnetic material and having a narrower end and a wider end connected by inner and outer substantially conical surfaces and a conical axis coincident with the common longitudinal axis, the narrower end being positioned closer to the region of interest than the wider end, the conical section having a first value and a first orientation of remanence,
      ii) an inner essentially cylindrical magnetic section of permanent magnetic material and having a longitudinal axis coincident with the common longitudinal axis and adjacent and magnetically coupled to the wider end of the conical section, the inner cylindrical magnetic section extending radially in a direction away from the common longitudinal axis, the inner cylindrical magnetic section having a second value and a second orientation of remanence,
      iii) transition means for interfacing the wider end of the conical section and the adjacent end of the inner cylindrical magnetic section for at least partially correcting for field distortion in or near the region of interest arising from the magnetic coupling between the wider end of the conical section and the adjacent end of the inner cylindrical magnetic section, iv) a pole piece member of ferromagnetic material and positioned within the conical section adjacent its inner surface and having an axis also coincident with the common longitudinal axis, v) an outer cylindrical permanent magnetic section having an axis coincident with the common longitudinal axis and extending over the inner cylindrical magnetic section and the ferromagnetic pole piece member;

comprising the steps of providing field distortion compensation by a shimming technique for reducing field distortions due to fabrication tolerences:

A) constructing at least first rings of permanent magnetic material dimensioned to surround and contact the outer conical surfaces of both conical sections, B) magnetizing the first rings such that when positioned on the conical magnets, the orientation of their remanence is radial and perpendicular to the longitudinal axis, C) placing the first rings on the outer conical surface at its bottom vertex of both conical sections, D) if necessary, reconfiguring the first rings or adding second rings to the conical sections to further reduce field distortions.

28. A method of shimming a magnetic structure for generating a uniform magnetic field capable of implementing NMR imaging of the head of a patient within a region of interest as claimed in claim 27, further comprising the steps:

E) measuring the magnetic field uniformity over a reference sphere having an origin at the structure center and co-spherical with the region of interest before step C, F) re-measuring the magnetic field uniformity over the reference sphere having an origin at the structure center and co-spherical with the region of interest after step C, G) in step D, reconfiguring the rings based on the measurements of steps E and F to reduce distortion.

29. A method of shimming a magnetic structure for generating a uniform magnetic field capable of implementing NMR imaging of the head of a patient within a region of interest as claimed in claim 28, wherein at least second rings are added, the rings all being magnetized radially and being in inverted magnetic orientation relationship.

30. A magnetic structure for generating a uniform magnetic field capable of implementing NMR imaging of the head of a patient within a region of interest, the magnetic structure comprising:

a) first and second magnetic structures defining a first cavity having the region of interest and configured to accommodate the head of a patient and defining adjacent the first cavity a second cavity, larger than the first cavity, configured to accommodate the shoulders of the patient when the latter's head is positioned in the first cavity, the first and second magnetic structures being positioned on opposite sides of the first and second cavities and defining a common longitudinal axis through the centers of the first and second magnetic structures and providing access from the outside for surgical intervention to the head of the patient when positioned within the first cavity, b) each of the first and second magnetic structures comprising a magnetic structure including:

i) an annular conical section of permanent magnetic material and having a narrower end and a wider end connected by inner and outer substantially conical surfaces and a conical axis coincident with the common longitudinal axis, the narrower end being positioned closer to the region of interest than the wider end, the conical section having a first value and a first orientation of remanence, ii) an inner essentially cylindrical magnetic section of permanent magnetic material and having a longitudinal axis coincident with the common longitudinal axis and adjacent and magnetically coupled to the wider end of the conical section, the inner cylindrical magnetic section extending radially in a direction away from the common longitudinal axis, the inner cylindrical magnetic structure having a second value and a second orientation of remanence, iii) transition means for interfacing the wider end of the conical section and the adjacent end of the inner cylindrical magnetic section for at least partially correcting for field distortion in or near the region of interest arising from the magnetic coupling between the wider end of the conical section and the adjacent end of the inner cylindrical magnetic section, iv) a pole piece member of ferromagnetic material and positioned within the conical section adjacent its inner surface and having an axis also coincident with the common longitudinal axis, v) an outer cylindrical permanent magnetic section having an axis coincident with the common longitudinal axis and extending over the inner cylindrical magnetic section and the ferromagnetic pole piece member;

vi) shimming means for reducing field distortions in or near the region of interest, said shimming means comprising:

A) at least a first radially magnetized ring positioned on the outer conical surface of the conical section at its bottom, said first ring being configured to reduce field distortion.

31. A magnetic structure as claimed in claim 30, further comprising at least a second radially magnetized ring positioned on the outer conical surface of the conical section axially spaced from the first ring, the magnetic orientations of the first and second rings being in anti-parallel relationship.

32. A magnetic structure as claimed in claim 31, wherein the magnetic orientations of the respective first and respective second rings on the first and second magnetic structures are in anti-parallel relationship.

33. A magnetic structure as claimed in claim 32, wherein the magnetic properties and configuration of the conical section and inner cylindrical section are based on an initial selected design factor K, the magnetic structure being actually configured on the basis of a design factor K selected to have a value slightly larger than the factor originally used in the design such that the field uniformity in the region of interest is improved.

* * * * *